United States Patent
Kondo

(10) Patent No.: US 10,262,928 B2
(45) Date of Patent: Apr. 16, 2019

(54) SEMICONDUCTOR DEVICE

(71) Applicant: ROHM CO., LTD., Kyoto-shi, Kyoto (JP)

(72) Inventor: Yuki Kondo, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/914,533

(22) Filed: Mar. 7, 2018

(65) Prior Publication Data

US 2018/0277468 A1 Sep. 27, 2018

(30) Foreign Application Priority Data

Mar. 23, 2017 (JP) .................................. 2017-057831
Dec. 26, 2017 (JP) .................................. 2017-249969

(51) Int. Cl.
  *H01L 23/495* (2006.01)
  *H01L 23/31* (2006.01)

(52) U.S. Cl.
  CPC .... *H01L 23/49562* (2013.01); *H01L 23/3114* (2013.01); *H01L 23/4952* (2013.01); *H01L 23/49513* (2013.01); *H01L 23/49548* (2013.01); *H01L 23/49568* (2013.01); *H01L 23/49575* (2013.01); *H01L 23/3107* (2013.01); *H01L 23/49582* (2013.01)

(58) Field of Classification Search
  CPC ........... H01L 23/49513; H01L 23/4952; H01L 23/49575; H01L 23/3114
  USPC ................................................ 257/676, 723
  See application file for complete search history.

(56) References Cited

U.S. PATENT DOCUMENTS

| 7,145,224 | B2* | 12/2006 | Kawashima | ...... H01L 23/49562 257/678 |
| 7,436,070 | B2* | 10/2008 | Uno | ........................ H01L 24/49 257/337 |
| 7,687,902 | B2* | 3/2010 | Shiraishi | ............. H01L 23/3107 257/723 |
| 8,018,054 | B2* | 9/2011 | Liu | ................... H01L 23/49575 257/672 |
| 8,138,598 | B2* | 3/2012 | Shiraishi | ............. H01L 23/3107 257/723 |
| 8,723,300 | B2* | 5/2014 | Wu | .................. H01L 23/49575 257/676 |

(Continued)

FOREIGN PATENT DOCUMENTS

JP 2013239740 A 11/2013

*Primary Examiner* — Nitin Parekh
(74) *Attorney, Agent, or Firm* — Hamre, Schumann, Mueller & Larson, P.C.

(57) ABSTRACT

A semiconductor device 1 includes a first drain terminal 4, connected to a drain electrode of a first semiconductor chip, a first gate terminal 5, connected to a gate electrode of the first semiconductor chip, a second drain terminal 6, connected to a drain electrode of a second semiconductor chip, a second gate terminal 7, connected to a gate electrode of the second semiconductor chip, a common source terminal 8, connected to a source electrode of the first semiconductor chip and a source electrode of the second semiconductor chip, and a sealing resin 9, sealing the respective semiconductor chips and the respective terminals. The respective terminals have exposed surfaces (lower surfaces) 43, 53, 63, 73, and 83 substantially flush with an outer surface (lower surface) 9b of the sealing resin 9 and exposed from the outer surface 9b.

20 Claims, 28 Drawing Sheets

(56) References Cited

U.S. PATENT DOCUMENTS

| | | | |
|---|---|---|---|
| 2010/0289127 A1* | 11/2010 | Kanazawa | H01L 24/37 |
| | | | 257/666 |
| 2011/0024917 A1* | 2/2011 | Bhalla | H01L 23/4952 |
| | | | 257/777 |
| 2013/0043576 A1* | 2/2013 | Nakamura | H01L 29/66 |
| | | | 257/676 |
| 2013/0049137 A1* | 2/2013 | Uno | H01L 27/088 |
| | | | 257/401 |
| 2013/0069163 A1* | 3/2013 | Bhalla | H01L 23/3171 |
| | | | 257/368 |
| 2017/0221800 A1* | 8/2017 | Nishikizawa | H01L 23/49575 |
| 2018/0152113 A1* | 5/2018 | Xu | H01L 23/49531 |

* cited by examiner

SEMICONDUCTOR DEVICE

BACKGROUND OF THE INVENTION

1. Field of the Invention

The present invention relates to a semiconductor device that can be used as a bidirectional switch.

2. Description of the Related Art

As a semiconductor device, there is known a semiconductor device (hereinafter referred to as "conventional semiconductor device") that includes a first semiconductor chip, constituted of a MOSFET, a second semiconductor chip, constituted of a MOSFET, a first drain terminal, a first source terminal, a first gate terminal, a second drain terminal, a second source terminal, and a second gate terminal. The first drain terminal, the first source terminal, and the first gate terminal are electrically connected to a drain electrode, a source and a gate electrode, respectively of the first semiconductor chip. The second drain terminal, the second source terminal, and the second gate terminal are electrically connected to a drain electrode, a source and a gate electrode, respectively of the second semiconductor chip.

SUMMARY OF THE INVENTION

The inventor of preferred embodiments of the present invention described and claimed in the present application conducted an extensive study and research regarding a semiconductor device, such as the one described above, and in doing so, discovered and first recognized new unique challenges and previously unrecognized possibilities for improvements as described in greater detail below.

If the conventional semiconductor device is to be used as a bidirectional switch with an arrangement where two MOSFETs are connected back-to-back, the source terminal of the first semiconductor chip and the source terminal of the second semiconductor chip must be connected via a connecting member at an exterior of the semiconductor device.

An object of the present invention is to provide a semiconductor device which, in use as a bidirectional switch, does not require the source terminal of the first semiconductor chip and the source terminal of the second semiconductor chip to be connected externally and enables miniaturization.

In order to overcome the previously unrecognized and unsolved challenges described above, a preferred embodiment of the present invention provides a semiconductor device. A preferred embodiment of the present invention provides a semiconductor device. The semiconductor device includes a first semiconductor chip, constituted of a MOSFET, a second semiconductor chip, constituted of a MOSFET, a first drain terminal, electrically connected to a drain electrode of the first semiconductor chip, a first gate terminal, electrically connected to a gate electrode of the first semiconductor chip, a second drain terminal, electrically connected to a drain electrode of the second semiconductor chip, a second gate terminal, electrically connected to a gate electrode of the second semiconductor chip, a common source terminal, electrically connected to a source electrode of the first semiconductor chip and a source electrode of the second semiconductor chip, and a sealing resin, sealing the respective semiconductor chips and the respective terminals, and each of the terminals has an exposed surface substantially flush with an outer surface of the sealing resin and exposed from the outer surface.

With the present semiconductor device, the source electrode of the first semiconductor chip and the source electrode of the second semiconductor chip are electrically connected to the common source terminal. Therefore, when the present semiconductor device is used as a bidirectional switch, there is no need to connect the source electrode of the first semiconductor chip and the source electrode of the second semiconductor chip at an exterior of the semiconductor device.

Also with the present semiconductor device, each terminal has the exposed surface that is substantially flush with the outer surface of the sealing resin and exposed from the outer surface and therefore miniaturization can be achieved in comparison to a semiconductor device having lead terminals projecting from the outer surface of the sealing resin.

In the preferred embodiment of the present invention, the sealing resin has two opposing surfaces and a side surface joining the surfaces.

In the preferred embodiment of the present invention, the exposed surface of each terminal includes a first exposed surface substantially flush with one surface of the two surfaces of the sealing resin and exposed from the one surface.

In the preferred embodiment of the present invention, the exposed surface of each terminal further includes a second exposed surface, continuous to the first exposed surface of the terminal, substantially flush with the side surface of the sealing resin and exposed from the side surface.

In the preferred embodiment of the present invention, the sealing resin is of rectangular parallelepiped shape with plan view shapes of the two surfaces being rectangular and the side surface includes four side surfaces joining opposing sides of the two surfaces to each other.

In the preferred embodiment of the present invention, the one surface of the sealing resin has a first side and a second side that are mutually opposed, a third side joining one ends of the first side and the second side together, and a fourth side joining other ends of the first side and the second side together, the first exposed surface of the first drain terminal is disposed at a first corner portion at which the first side and the third side of the one surface are joined, and the first exposed surface of the second drain terminal is disposed at a second corner portion at which the first side and the fourth side of the one surface are joined. Also, the first exposed surface of the first gate terminal is disposed at a third corner portion at which the second side and the third side of the one surface are joined, and the first exposed surface of the second gate terminal is disposed at a fourth corner portion at which the second side and the fourth side of the one surface are joined. The first exposed surface of the common source terminal is disposed at an intermediate position of the one surface between the first exposed surface of the first gate terminal and the first exposed surface of the second gate terminal.

In the preferred embodiment of the present invention, the first exposed surface of each terminal has a rectangular shape having four sides parallel to the four sides of the one surface. And if, with the first exposed surface of each drain terminal, a length of the side parallel to the first side is LD1 and a length of the side parallel to the third side is LD2, and with the first exposed surface of each gate terminal, a length of the side that is parallel to the first side is LG1 and a length of the side parallel to the third side is LG2, and with the first exposed surface of the source terminal, a length of the side that is parallel to the first side is LS1 and a length of the side parallel to the third side is LS2, and an interval, along a direction along the first side, between the first exposed surface of the first drain terminal and the first exposed surface of the second drain terminal is d1, an interval, along a direction along the second side, between the first exposed surface of the first gate terminal and the first exposed surface of the common source terminal is d2, an interval, along the direction along the second side, between the first exposed surface of the second gate terminal and the first exposed surface of the common source terminal is d3, an interval, along a direction along the third side, between the first exposed surface of the first drain terminal and the first exposed surface of the first gate terminal is d4, and an interval, along a direction along the fourth side, between the first exposed surface of the second drain terminal and the first exposed surface of the second gate terminal is d5, the following formulae (a) and (b) are established.

$$d1=d2=d3=d4=d5 \quad (a)$$

$$LS2=LG2 \quad (b)$$

In the preferred embodiment of the present invention, the following formulae (c) to (f) are further established.

$$LS1=d1 \quad (c)$$

$$LD2=LD1 \quad (d)$$

$$LG2=LG1 \quad (e)$$

$$LD1>LG1 \quad (f)$$

In the preferred embodiment of the present invention, a sum of an area of the first exposed surface of the first drain terminal and an area of the first exposed surface of the second drain terminal is ¼ to ⅜ of an area of an entirety of the one surface of the sealing resin.

In the preferred embodiment of the present invention, a sum of an area of the first exposed surface of the first drain terminal, an area of the first exposed surface of the second drain terminal, an area of the first exposed surface of the first gate terminal, an area of the first exposed surface of the second gate terminal, and an area of the first exposed surface of the common source terminal is ⅓ to ¹¹⁄₂₄ of an area of an entirety of the one surface of the sealing resin.

In the preferred embodiment of the present invention, the first exposed surface of each of the first drain terminal, the second drain terminal, the first gate terminal, and the second gate terminal has, in plan view, a quadrilateral shape having a fifth side and a sixth side, matching two sides of a corner portion of the sealing resin at which the exposed surface is disposed, and a seventh side and an eighth side, with one ends connected to the fifth side and sixth side, respectively, and other ends connected to each other, and a connection portion of the seventh side and the eighth side is formed to a curved shape projecting outward of the first exposed surface.

In the preferred embodiment of the present invention, the first exposed surface of the common source terminal has, in plan view, a quadrilateral shape having a ninth side matching the second side of the one surface of the sealing resin, a tenth side and an eleventh side, with one ends respectively connected to respective ends of the ninth side, and a twelfth side, connecting the tenth side and the eleventh side, and a connection portion of the tenth side and the twelfth side and a connection portion of the eleventh side and the twelfth side are formed to curved shapes projecting outward of the first exposed surface.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
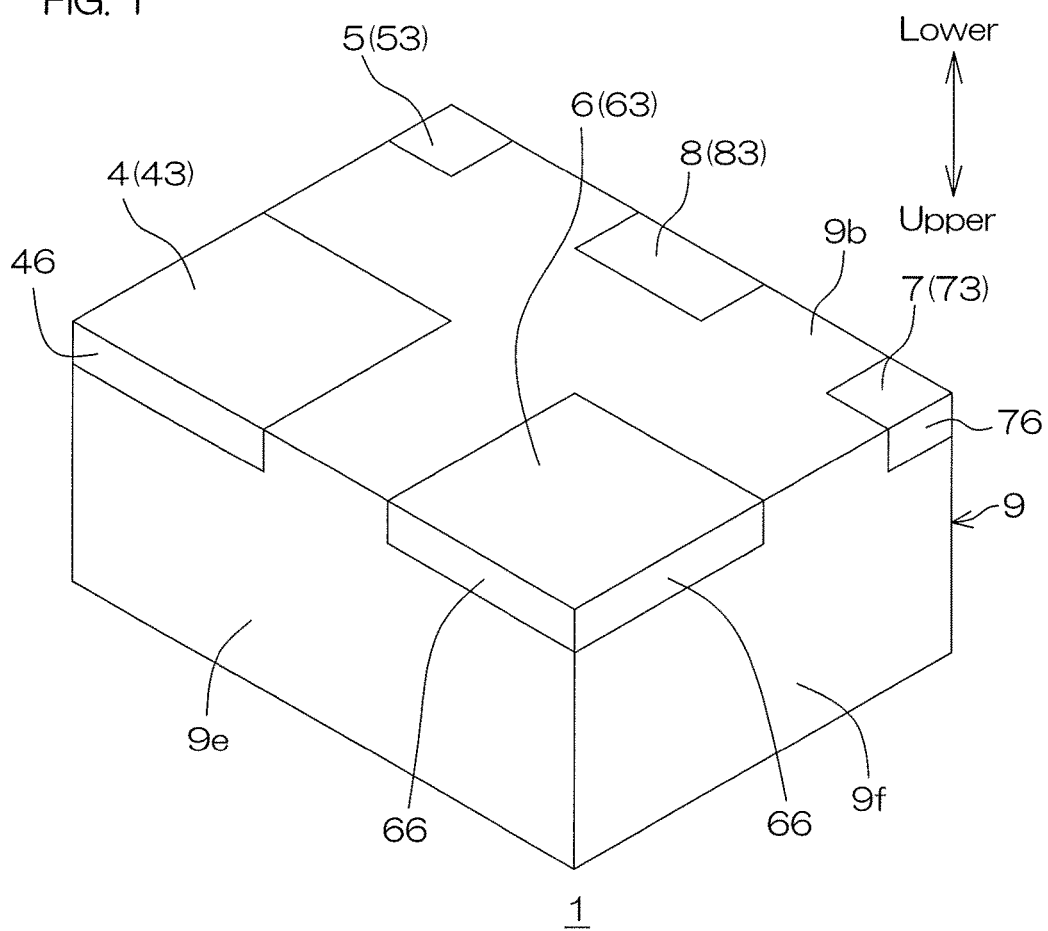
FIG. 1 is an illustrative perspective view of a semiconductor device according to a first preferred embodiment of the present invention.
Figure 2:
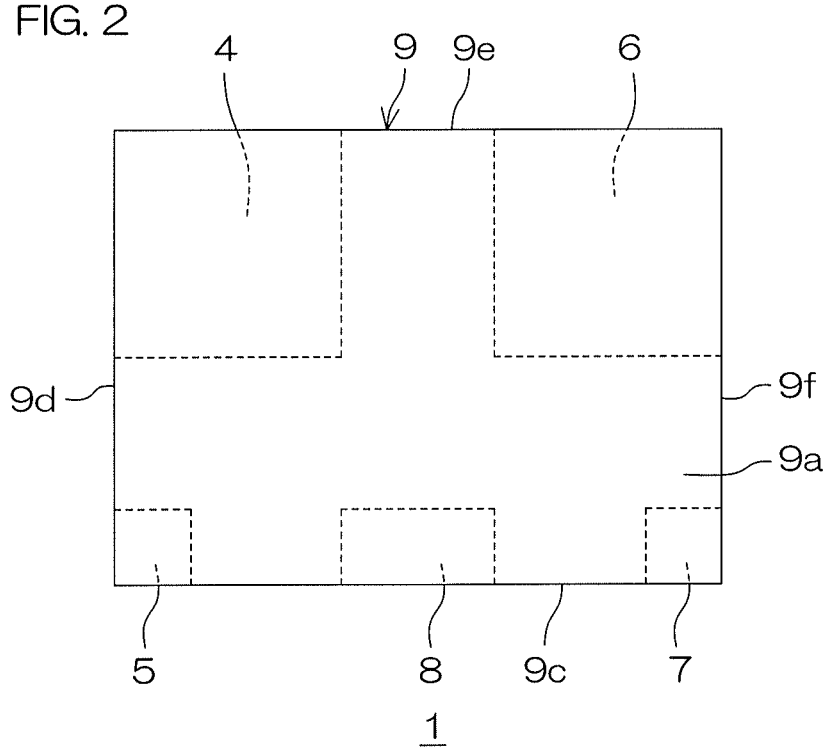
FIG. 2 is an illustrative plan view of FIG. 1.
Figure 3:
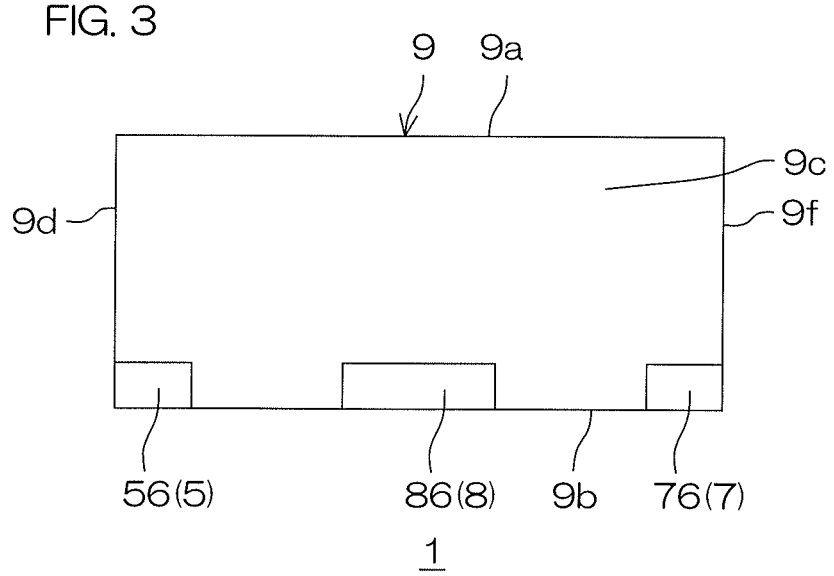
FIG. 3 is an illustrative front view of FIG. 1.
Figure 4:
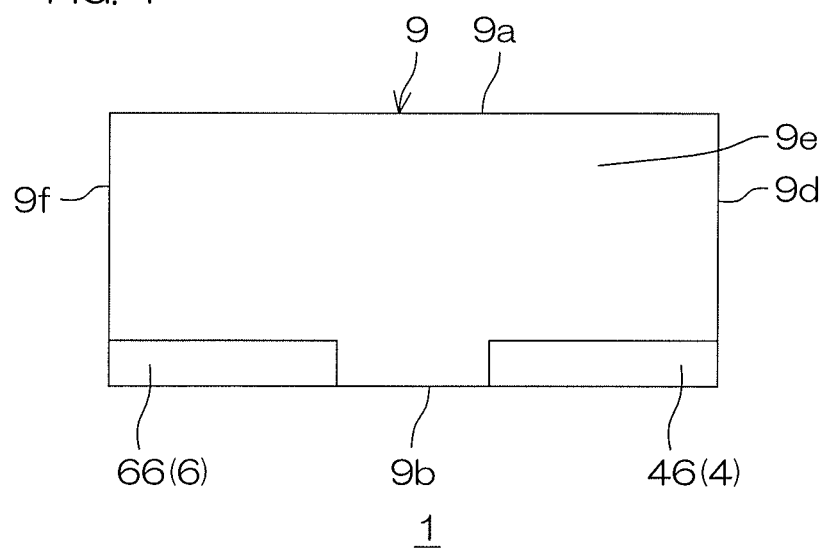
FIG. 4 is an illustrative rear view of FIG. 1.
Figure 5:
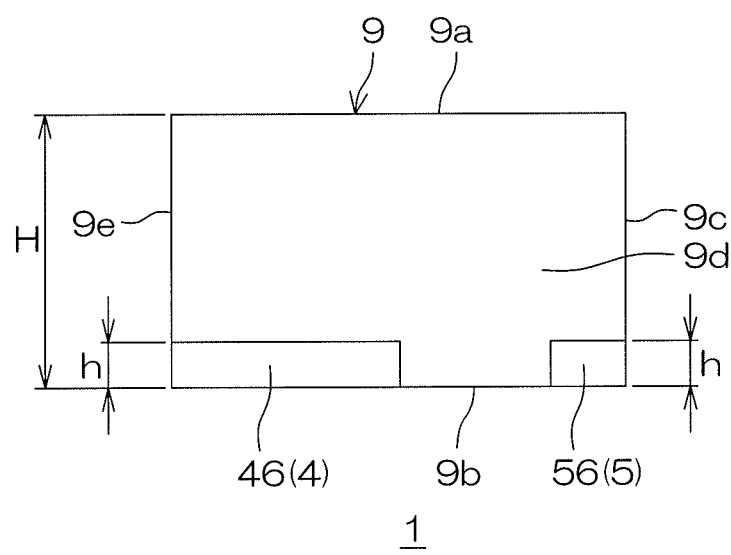
FIG. 5 is an illustrative left side view of FIG. 1.
Figure 6:
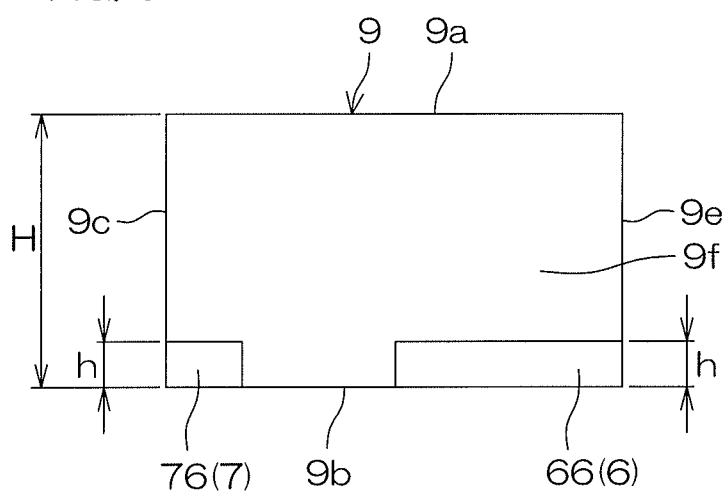
FIG. 6 is an illustrative right side view of FIG. 1.
Figure 7:
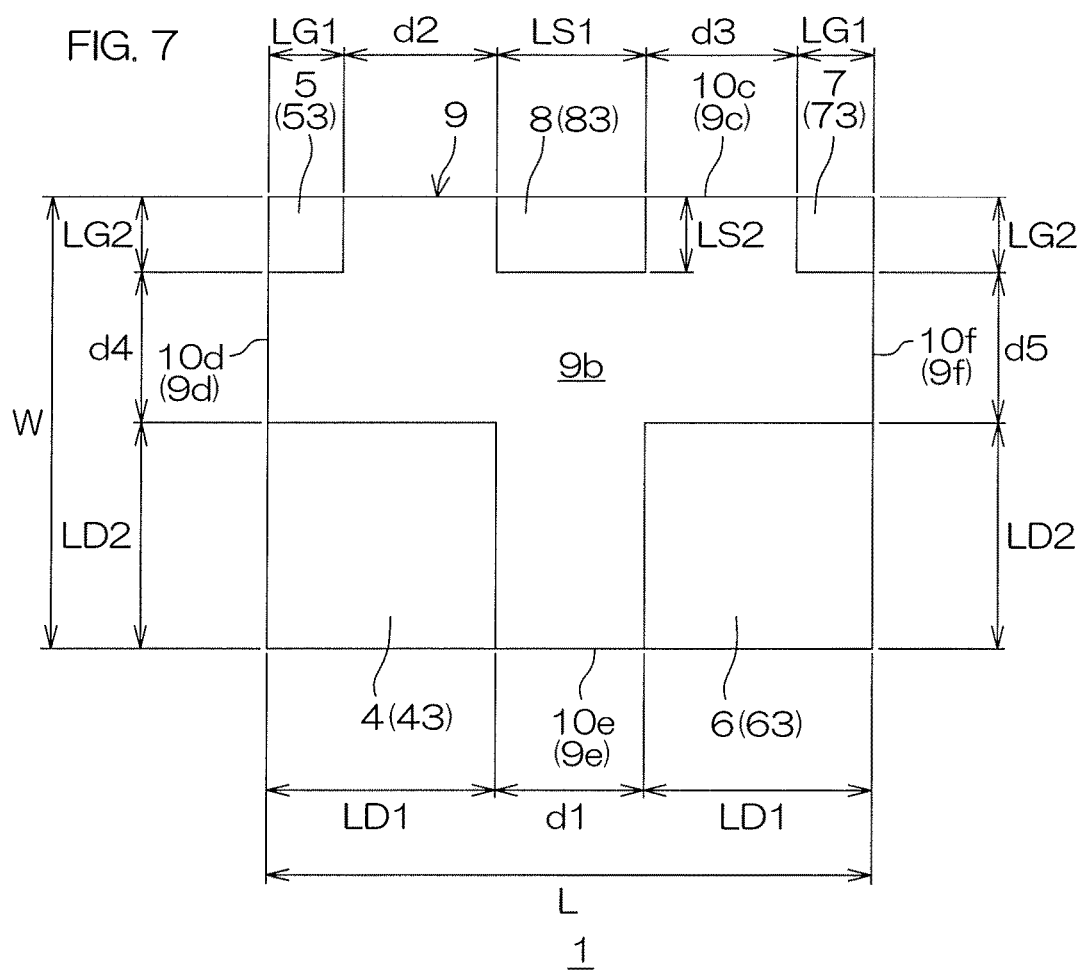
FIG. 7 is an illustrative bottom view of FIG. 1.
Figure 8:
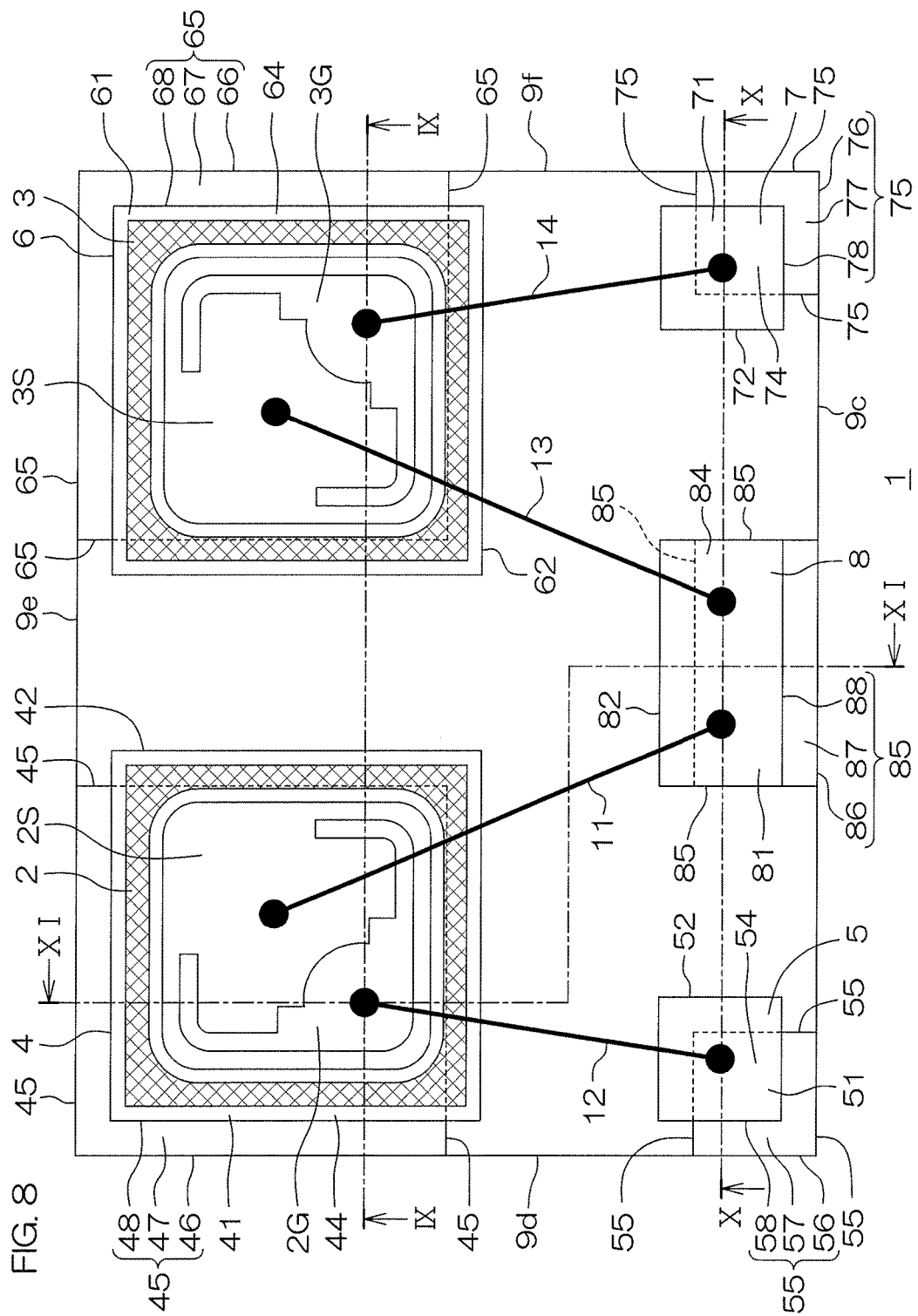
FIG. 8 is a plan view of an internal structure.
Figure 9:
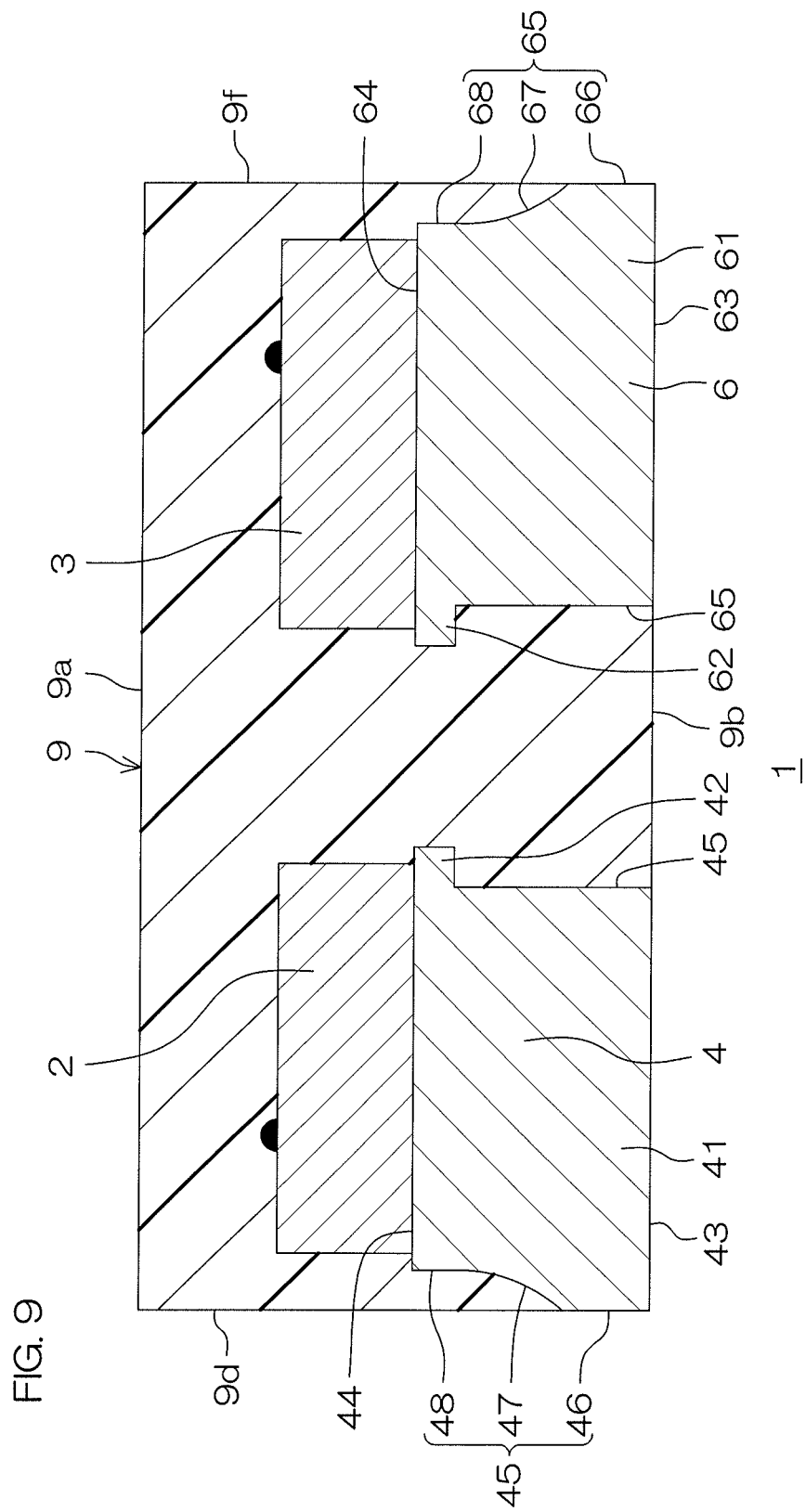
FIG. 9 is a sectional view taken along line IX-IX of FIG. 8.
Figure 10:
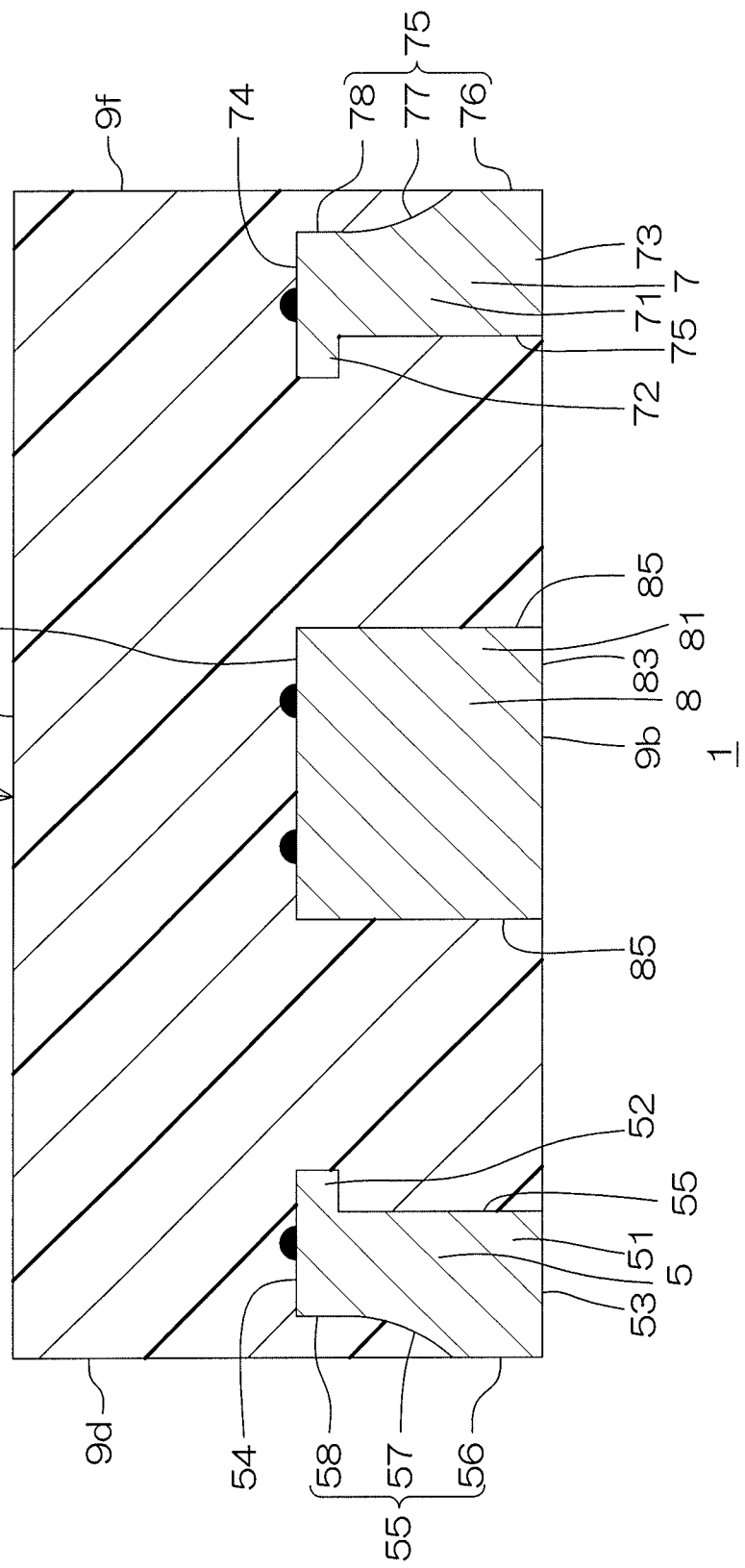
FIG. 10 is a sectional view taken along line X-X of FIG. 8.
Figure 11:
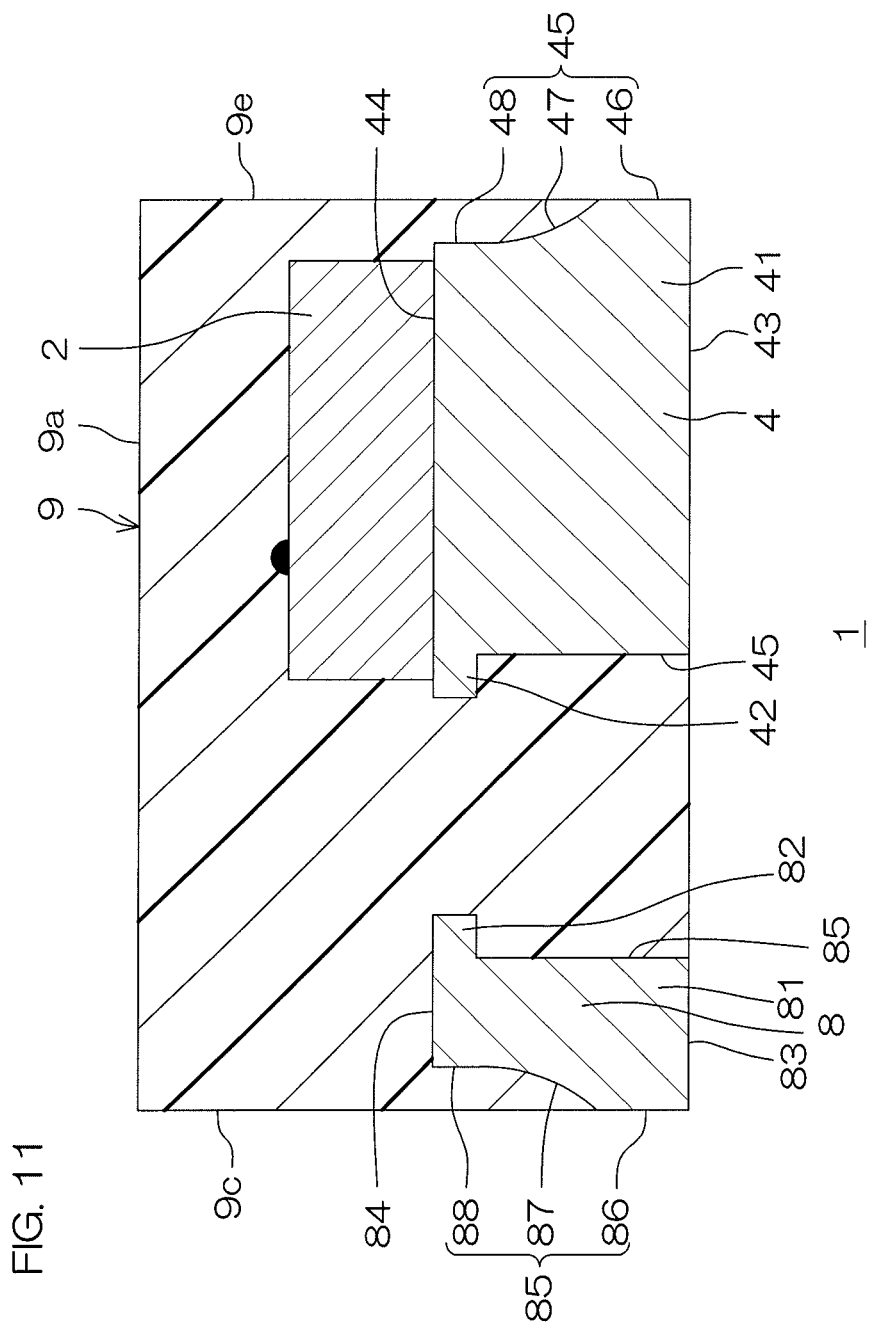
FIG. 11 is a sectional view taken along line XI-XI of FIG. 8.

Preferred embodiments of the present invention shall now be described in detail with reference to the attached drawings.
FIG. 1 is an illustrative perspective view of a semiconductor device according to a first preferred embodiment of the present invention. FIG. 2 is an illustrative plan view of FIG. 1. FIG. 3 is an illustrative front view of FIG. 1. FIG. 4 is an illustrative rear view of FIG. 1. FIG. 5 is an illustrative left side view of FIG. 1. FIG. 6 is an illustrative right side view of FIG. 1. FIG. 7 is an illustrative bottom view of FIG. 1. FIG. 8 is a plan view of an internal structure. FIG. 9 is a sectional view taken along line IX-IX of FIG. 8. FIG. 10 is a sectional view taken along line X-X of FIG. 8. FIG. 11 is a sectional view taken along line XI-XI of FIG. 8.

Figure 14:
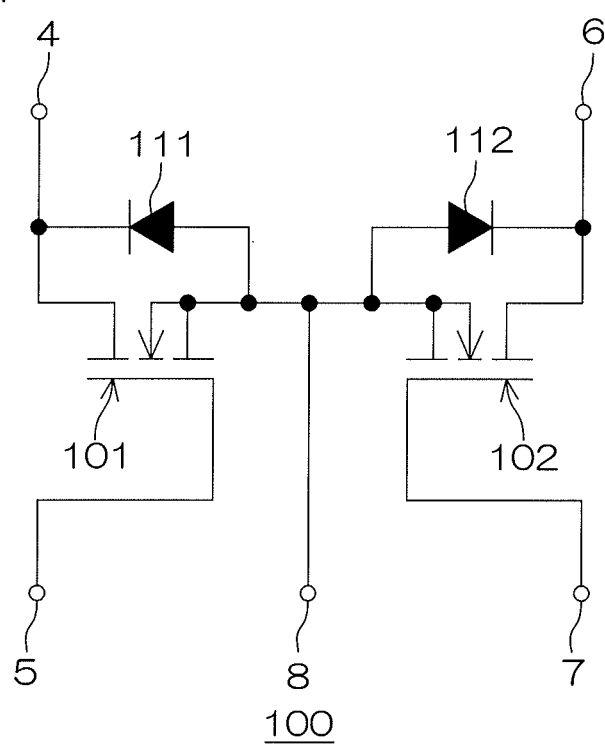
FIG. 14 is an electric circuit diagram of an electric circuit of a bidirectional switch realized by the semiconductor device of FIG. 1.

The semiconductor device 1 shown in FIG. 1 to FIG. 11 is a device arranged to realize a bidirectional switch 100 represented by an electric circuit such as shown in FIG. 14. The bidirectional switch 100 includes a first MOSFET 101 and a second MOSFET 102 that are connected back-to-back (back-to-back connection). In the example of FIG. 1, each of the MOSFETs 101 and 102 is an n channel type MOSFET. The first MOSFET 101 has a first parasitic diode 111. The first parasitic diode 111 is antiparallel-connected to the first MOSFET 101. Specifically, an anode of the first parasitic diode 111 is connected to a source of the first MOSFET 101, and a cathode of the first parasitic diode 111 is connected to a drain of the first MOSFET 101.

The second MOSFET 102 includes a second parasitic diode 112. The second parasitic diode 112 is antiparallel-connected to the second MOSFET 102. Specifically, an anode of the second parasitic diode 112 is connected to a source of the second MOSFET 102, and a cathode of the second parasitic diode 112 is connected to a drain of the second MOSFET 102.

The source of the first MOSFET 101 is connected to the source of the second MOSFET 102. That is, the source of the first MOSFET 101 and the source of the second MOSFET 102 are serially connected (back-to-back connected) such that directions of the first parasitic diode 111 and the second parasitic diode 112 are opposite.

The bidirectional switch 100 includes a first drain terminal 4, connected to a drain electrode of the first MOSFET 101, and a first gate terminal 5, connected to a gate electrode of the first MOSFET 101. The bidirectional switch 100 also includes a second drain terminal 6, connected to a drain electrode of the second MOSFET 102, and a second gate terminal 7, connected to a gate electrode of the second MOSFET 102. The bidirectional switch 100 further includes a common source terminal 8 connected to a source electrode of the first MOSFET 101 and a source electrode of the second MOSFET 102.

When a gate signal applied to the first gate terminal 5 and the second gate terminal 7 is set to an active level, the first and second MOSFETs 101 and 102 are turned on and it thus becomes possible to make a current flow bidirectionally between the first drain terminal 4 and the second drain terminal 6. When the gate signal applied to the first gate terminal 5 and the second gate terminal 7 is set to an inactive level, the first and second MOSFETs 101 and 102 are turned off. The parasitic diodes 111 and 112 are connected so as to be mutually opposite in direction and therefore in the state where the first and second MOSFETs 101 and 102 are off, the bidirectional flow of current is prevented.

Figure 15:
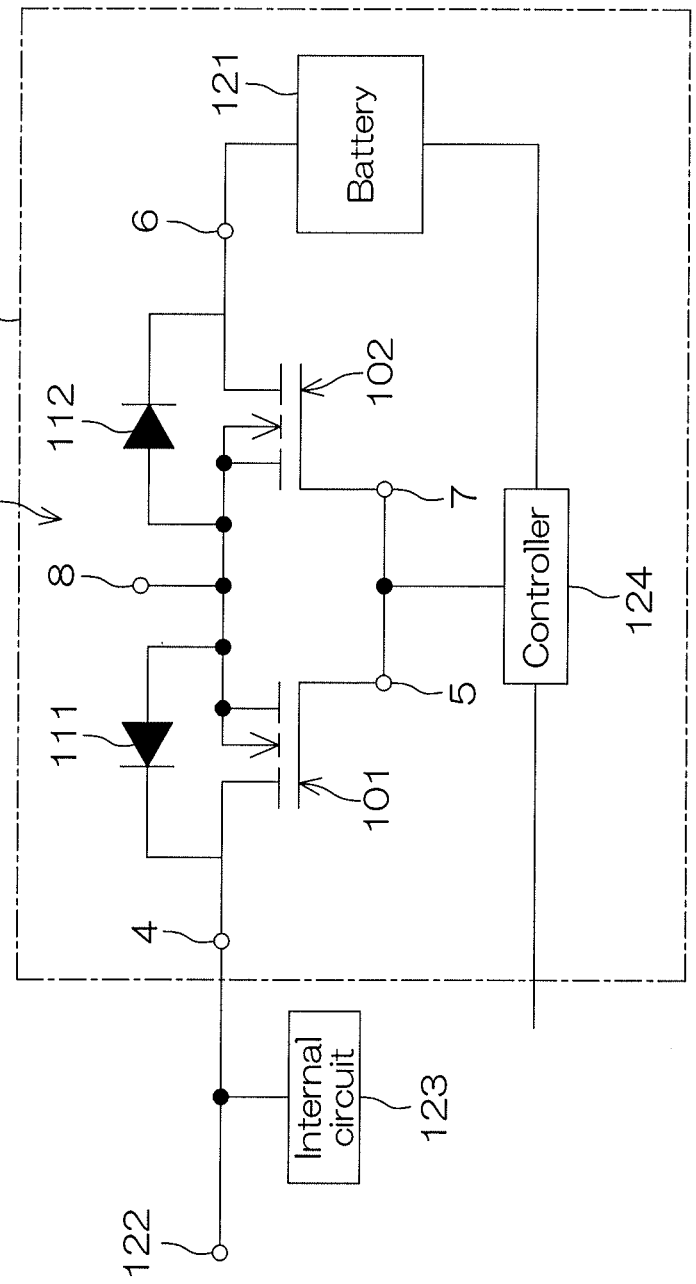
FIG. 15 is a circuit diagram for describing an example of use of the bidirectional switch of FIG. 14.

Such a bidirectional switch 100 is, for example, provided in a power supply portion 130 inside a notebook type PC as shown in FIG. 15. Specifically, one drain terminal 6 of the bidirectional switch 100 is connected to a battery 121. The other drain terminal 4 of the bidirectional switch 100 is connected to a DC input terminal 122 and an internal circuit 123. The gate signal of the bidirectional switch 100 is controlled by a controller 124. When the gate signal of the bidirectional switch 100 is set to the active level, the bidirectional switch 100 is turned on and the battery 121 is connected to the DC input terminal 122 and the internal circuit 123. When the gate signal of the bidirectional switch 100 is set to the inactive level, the bidirectional switch 100 is turned off and the battery 121 is disconnected from the DC input terminal 122 and the internal circuit 123.

The semiconductor device 1 shall now be described in detail with reference to FIG. 1 to FIG. 11. In the following description, up shall refer to an upper side of the paper surface of FIG. 3 (front view), down shall refer to a lower side of the paper surface of FIG. 3, left shall refer to a left side of the paper surface of FIG. 3, right shall refer to a right side of the paper surface of FIG. 3, front shall refer to a lower side of the paper surface of FIG. 2 (plan view), and rear shall refer to an upper side of the paper surface of FIG. 2. FIG. 1 shows an appearance of the semiconductor device 1 in a state where a bottom surface (lower surface) is disposed to face upward. In FIG. 1, a rear surface (rear side surface) of the semiconductor device 1 faces forward and a front surface (front side surface) of the semiconductor device 1 faces rearward.

Mainly referring to FIG. 1 and FIG. 8 to FIG. 11, the semiconductor device 1 includes a first semiconductor chip 2, functioning as the first MOSFET 101 of FIG. 14, a second semiconductor chip 3, functioning as the second MOSFET 102 of FIG. 14, the first drain terminal 4, the first gate terminal 5, the second drain terminal 6, the second gate terminal 7, the common source terminal 8, first to fourth bonding wires (metal connecting members) 11 to 14, and a sealing resin 9.

The first semiconductor chip 2 is die-bonded on the first drain terminal 4 in a state where a surface (device forming surface), at a side at which a functional element is formed, is faced upward. A drain electrode is formed at a bottom surface (lower surface) of the first semiconductor chip 2. The drain electrode of the first semiconductor chip 2 is mechanically and electrically connected to an upper surface of the first drain terminal 4.

A source electrode (source pad) 2S and a gate electrode (gate pad) 2G (see FIG. 8) are formed on a top surface (upper surface) of the first semiconductor chip 2. The source electrode 2S is connected to the common source terminal 8 by the bonding wire 11. The gate electrode 2G is connected to the first gate terminal 5 by the bonding wire 12.

The second semiconductor chip 3 is die-bonded on the second drain terminal 6 in a state where a surface (device forming surface), at a side at which a functional element is formed, is faced upward. A drain electrode is formed at a bottom surface (lower surface) of the second semiconductor chip 3. The drain electrode of the second semiconductor chip 3 is mechanically and electrically connected to an upper surface of the second drain terminal 6.

A source electrode (source pad) 3S and a gate electrode (gate pad) 3G (see FIG. 8) are formed on a top surface (upper surface) of the second semiconductor chip 3. The source electrode 3S is connected to the common source terminal 8 by the bonding wire 13. The gate electrode 3G is connected to the second gate terminal 7 by the bonding wire 14. The respective terminals 4 to 8 are formed from metal thin plates constituted of copper or an alloy that contains copper.

The sealing resin 9 is constituted, for example, of an epoxy resin. As shown in FIG. 1, the sealing resin 9 is formed, for example, to a substantially rectangular parallelepiped shape that is flat in a vertical direction. The vertical direction is synonymous to a thickness direction of the semiconductor device 1. The sealing resin 9 of substantially rectangular parallelepiped shape has an upper surface 9a, constituting a top surface, a lower surface 9b, constituting a bottom surface, and side surfaces 9c to 9f extending in substantially perpendicular directions with respect to the upper surface 9a and the lower surface 9b. The upper surface 9a and the lower surface 9b are both flat surfaces.

The upper surface 9a and the lower surface 9b are formed to rectangular shapes that are long in a right/left direction in plan view. The side surfaces 9c to 9f are continuous to the upper surface 9a and the lower surface 9b. In detail, the side surfaces 9c to 9f are formed over an entire periphery, excluding the upper surface 9a and the lower surface 9b, of the semiconductor device 1. In other words, the semiconductor device 1 has the four side surfaces 9c to 9f that are continuous to respective four sides of the upper surface 9a and the lower surface 9b. The four side surface 9c to 9f are constituted of the front side surface 9c, the left side surface 9d, the rear side surface 9e, and the right side surface 9f.

As shown in FIG. 8, when an interior of the sealing resin 9 is viewed from a plane, the first drain terminal 4 is disposed at a left rearward corner portion, the second drain terminal 6 is disposed at a right rearward corner portion, the first gate terminal 5 is disposed at a left forward corner portion, the second gate terminal 7 is disposed at a right forward corner portion, and the common source terminal 8 is disposed at a position between the first gate terminal 5 and the second gate terminal 7.

Referring to FIG. 1, FIG. 8, and FIG. 9, the first drain terminal 4 has, integrally, a terminal main body portion 41 of rectangular parallelepiped shape having a rectangular bottom surface shape, and a terminal detachment restraining portion 42. The terminal main body portion 41 has a lower surface 43, an upper surface 44, positioned at an opposite side to the lower surface 43, and four side surfaces 45, connecting the lower surface 43 and the upper surface 44. The lower surface 43 of the terminal main body portion 41 is substantially flush with the lower surface 9b of the sealing resin 9 and is exposed from the lower surface 9b. That is, the lower surface 43 of the terminal main body portion 41 constitutes a first exposed surface of the first drain terminal 4. In bottom view (plan view), the terminal main body portion 41 is disposed at the left rear side corner portion of the lower surface 9b of the sealing resin 9 in an orientation where four sides of the lower surface 43 of the terminal main body portion 41 are substantially parallel to four sides of the lower surface 9b of the sealing resin 9.

Among the four side surfaces 45 of the terminal main body portion 41, each of the left side surface and the rear side surface has a first side surface portion 46, a second side surface portion 48, and a joining portion 47. The first side surface portion 46 is continuous to the lower surface 43 and extends substantially perpendicularly toward the upper surface 44. The second side surface portion 48 is continuous to the upper surface 44 and extends substantially perpendicularly toward the lower surface 43. At each of the left side surface and the rear side surface of the terminal main body portion 41, the first side surface portion 46 protrudes further outward in a side direction (direction orthogonal to the vertical direction) than the second side surface portion 48. At each of the left side surface and the rear side surface of the terminal main body portion 41, the joining portion 47 extends from the second side surface portion 48 toward the first side surface portion 46 while expanding outward gradually in the side direction and connects the second side surface portion 48 and the first side surface portion 46.

The first side surface portion 46 of the left side surface and the first side surface portion 46 of the rear side surface of the terminal main body portion 41 are respectively substantially flush with the left side surface 9d and the rear side surface 9e of the sealing resin 9 and are exposed from the left side surface 9d and the rear side surface 9e. That is, the first side surface portion 46 of the left side surface and the first side surface portion 46 of the rear side surface of the terminal main body portion 41 constitute second exposed surfaces of the first drain terminal 4 that are continuous to the first exposed surface. An angle portion formed by intersection of the two first side surface portions 46 of the terminal main body portion 41 and angle portions formed by intersections of the respective first side surface portions 46 and the lower surface 43 are also exposed from the sealing resin 9.

The terminal detachment restraining portion 42 is formed such as to protrude outward in side directions from the right side surface and the front side surface of the terminal main body portion 41. The terminal detachment restraining portion 42 is formed to be thinner than the terminal main body portion 41. An upper surface of the terminal detachment restraining portion 42 is flush with the upper surface 44 of the terminal main body portion 41. The first semiconductor chip 2 is die-bonded to the upper surface of the first drain terminal 4 (including the upper surface 44 of the terminal main body portion 41 and the upper surface of the terminal detachment restraining portion 42).

A solder plating layer (not shown), arranged to increase solder wettability, is formed on the lower surface 43 of the terminal main body portion 41 exposed from the lower surface 9b of the sealing resin 9 and the first side surface portions 46 exposed from the left side surface 9d and the rear side surface 9e of the sealing resin 9.

The second drain terminal 6 has, integrally, a terminal main body portion 61 of rectangular parallelepiped shape having a rectangular bottom surface shape, and a terminal detachment restraining portion 62. The terminal main body portion 61 has a lower surface 63, an upper surface 64, positioned at an opposite side to the lower surface 63, and four side surfaces 65, connecting the lower surface 63 and the upper surface 64. The lower surface 63 of the terminal main body portion 61 is substantially flush with the lower surface 9b of the sealing resin 9 and is exposed from the lower surface 9b. That is, the lower surface 63 of the terminal main body portion 61 constitutes a first exposed surface of the second drain terminal 6. In bottom view (plan view), the terminal main body portion 61 is disposed at the right rear side corner portion of the lower surface 9b of the sealing resin 9 in an orientation where four sides of the lower surface 63 of the terminal main body portion 61 are substantially parallel to the four sides of the lower surface 9b of the sealing resin 9.

Among the four side surfaces 65 of the terminal main body portion 61, each of the right side surface and the rear side surface has a first side surface portion 66, a second side surface portion 68, and a joining portion 67. The first side surface portion 66 is continuous to the lower surface 63 and extends substantially perpendicularly toward the upper surface 64. The second side surface portion 68 is continuous to the upper surface 64 and extends substantially perpendicularly toward the lower surface 63. At each of the right side surface and the rear side surface of the terminal main body portion 61, the first side surface portion 66 protrudes further outward in a side direction (direction orthogonal to the vertical direction) than the second side surface portion 68. At each of the right side surface and the rear side surface of the terminal main body portion 61, the joining portion 67 extends from the second side surface portion 68 toward the first side surface portion 66 while expanding outward gradually in the side direction and connects the second side surface portion 68 and the first side surface portion 66.

The first side surface portion 66 of the right side surface and the first side surface portion 66 of the rear side surface of the terminal main body portion 61 are respectively substantially flush with the right side surface 9f and the rear side surface 9e of the sealing resin 9 and are exposed from the right side surface 9f and the rear side surface 9e. That is, the first side surface portion 66 of the right side surface and the first side surface portion 66 of the rear side surface of the terminal main body portion 61 constitute second exposed surfaces of the second drain terminal 6 that are continuous to the first exposed surface. An angle portion formed by intersection of the two first side surface portions 66 of the terminal main body portion 61 and angle portions formed by intersections of the respective first side surface portions 66 and the lower surface 63 are also exposed from the sealing resin 9.

The terminal detachment restraining portion 62 is formed such as to protrude outward in side directions from the left side surface and the front side surface of the terminal main body portion 61. The terminal detachment restraining portion 62 is formed to be thinner than the terminal main body portion 61. An upper surface of the terminal detachment restraining portion 62 is flush with the upper surface 66 of the terminal main body portion 61. The second semiconductor chip 3 is die-bonded to the upper surface of the second drain terminal 6 (including the upper surface 64 of the terminal main body portion 61 and the upper surface of the terminal detachment restraining portion 62).

A solder plating layer (not shown), arranged to increase solder wettability, is formed on the lower surface 63 of the terminal main body portion 61 exposed from the lower surface 9b of the sealing resin 9 and the first side surface portions 66 exposed from the right side surface 9f and the rear side surface 9e of the sealing resin 9.

Referring to FIG. 1, FIG. 8, and FIG. 10, the first gate terminal 5 has, integrally, a terminal main body portion 51 of rectangular parallelepiped shape having a rectangular bottom surface shape, and a terminal detachment restraining portion 52. The terminal main body portion 51 has a lower surface 53, an upper surface 54, positioned at an opposite side to the lower surface 53, and four side surfaces 55, connecting the lower surface 53 and the upper surface 54. The terminal main body portion 51 has its lower surface 53 exposed from the lower surface 9b of the sealing resin 9. The lower surface 53 of the terminal main body portion 51 is substantially flush with the lower surface 9b of the sealing resin 9 and is exposed from the lower surface 9b. That is, the lower surface 53 of the terminal main body portion 51 constitutes a first exposed surface of the first gate terminal 5. In bottom view (plan view), the terminal main body portion 51 is disposed at the left front side corner portion of the lower surface 9b of the sealing resin 9 in an orientation where four sides of the lower surface 53 of the terminal main body portion 51 are substantially parallel to the four sides of the lower surface 9b of the sealing resin 9.

Among the four side surfaces 55 of the terminal main body portion 51, each of the left side surface and the front side surface has a first side surface portion 56, a second side surface portion 58, and a joining portion 57. The first side surface portion 56 is continuous to the lower surface 53 and extends substantially perpendicularly toward the upper surface 54. The second side surface portion 58 is continuous to the upper surface 54 and extends substantially perpendicularly toward the lower surface 53. At each of the left side surface and the front side surface of the terminal main body portion 51, the first side surface portion 56 protrudes further outward in a side direction (direction orthogonal to the vertical direction) than the second side surface portion 58. At each of the left side surface and the front side surface of the terminal main body portion 51, the joining portion 57 extends from the second side surface portion 58 toward the first side surface portion 56 while expanding outward gradually in the side direction and connects the second side surface portion 58 and the first side surface portion 56.

The first side surface portion 56 of the left side surface and the first side surface portion 56 of the front side surface of the terminal main body portion 51 are respectively substantially flush with the left side surface 9d and the front side surface 9c of the sealing resin 9 and are exposed from the left side surface 9d and the front side surface 9c. That is, the first side surface portion 56 of the left side surface and the first side surface portion 56 of the front side surface of the terminal main body portion 51 constitute second exposed surfaces of the first gate terminal 5 that are continuous to the first exposed surface. An angle portion formed by intersection of the two first side surface portions 56 of the terminal main body portion 51 and angle portions formed by intersections of the respective first side surface portions 56 and the lower surface 53 are also exposed from the sealing resin 9.

The terminal detachment restraining portion 52 is formed such as to protrude outward in side directions from the right side surface and the rear side surface of the terminal main body portion 51. The terminal detachment restraining portion 52 is formed to be thinner than the terminal main body portion 51. An upper surface of the terminal detachment restraining portion 52 is flush with the upper surface 54 of the terminal main body portion 51. One end of the second bonding wire 12 is connected to the upper surface of the first gate terminal 5 (including the upper surface 54 of the terminal main body portion 51 and the upper surface of the terminal detachment restraining portion 52).

A solder plating layer (not shown), arranged to increase solder wettability, is formed on the lower surface 53 of the terminal main body portion 51 exposed from the lower surface 9b of the sealing resin 9 and the first side surface portions 56 exposed from the left side surface 9d and the front side surface 9c of the sealing resin 9.

The second gate terminal 7 has, integrally, a terminal main body portion 71 of rectangular parallelepiped shape having a rectangular bottom surface shape, and a terminal detachment restraining portion 72. The terminal main body portion 71 has a lower surface 73, an upper surface 74, positioned at an opposite side to the lower surface 73, and four side surfaces 75, connecting the lower surface 73 and the upper surface 74. The lower surface 73 of the terminal main body portion 71 is substantially flush with the lower surface 9b of the sealing resin 9 and is exposed from the lower surface 9b. That is, the lower surface 73 of the terminal main body portion 71 constitutes a first exposed surface of the second gate terminal 7. In bottom view (plan view), the terminal main body portion 71 is disposed at the right front side corner portion of the lower surface 9b of the sealing resin 9 in an orientation where four sides of the lower surface 73 of the terminal main body portion 71 are substantially parallel to the four sides of the lower surface 9b of the sealing resin 9.

Among the four side surfaces 75 of the terminal main body portion 71, each of the right side surface and the front side surface has a first side surface portion 76, a second side surface portion 78, and a joining portion 77. The first side surface portion 76 is continuous to the lower surface 73 and extends substantially perpendicularly toward the upper surface 74. The second side surface portion 78 is continuous to the upper surface 74 and extends substantially perpendicularly toward the lower surface 73. At each of the right side surface and the front side surface of the terminal main body portion 71, the first side surface portion 76 protrudes further outward in a side direction (direction orthogonal to the vertical direction) than the second side surface portion 78. At each of the right side surface and the front side surface of the terminal main body portion 71, the joining portion 77 extends from the second side surface portion 78 toward the first side surface portion 76 while expanding outward gradually in the side direction and connects the second side surface portion 78 and the first side surface portion 76.

The first side surface portion 76 of the right side surface and the first side surface portion 76 of the front side surface of the terminal main body portion 71 are respectively substantially flush with the right side surface 9f and the front side surface 9c of the sealing resin 9 and are exposed from the right side surface 9f and the front side surface 9c. That is, the first side surface portion 76 of the right side surface and the first side surface portion 76 of the front side surface of the terminal main body portion 71 constitute second exposed surfaces of the second drain terminal 7 that are continuous to the first exposed surface. An angle portion formed by intersection of the two first side surface portions 76 of the terminal main body portion 71 and angle portions formed by intersections of the respective first side surface portions 76 and the lower surface 73 are also exposed from the sealing resin 9.

The terminal detachment restraining portion 72 is formed such as to protrude outward in side directions from the left side surface and the rear side surface of the terminal main body portion 71. The terminal detachment restraining portion 72 is formed to be thinner than the terminal main body portion 71. An upper surface of the terminal detachment restraining portion 72 is flush with the upper surface 74 of the terminal main body portion 71. One end of the fourth bonding wire 14 is connected to the upper surface of the second gate terminal 7 (including the upper surface 74 of the terminal main body portion 71 and the upper surface of the terminal detachment restraining portion 72).

A solder plating layer (not shown), arranged to increase solder wettability, is formed on the lower surface 73 of the terminal main body portion 71 exposed from the lower surface 9b of the sealing resin 9 and the first side surface portions 76 exposed from the right side surface 9f and the front side surface 9c of the sealing resin 9.

Referring to FIG. 1, FIG. 8, FIG. 10, and FIG. 11, the common source terminal 8 has, integrally, a terminal main body portion 81 of rectangular parallelepiped shape having a rectangular bottom surface shape, and a terminal detachment restraining portion 82. The terminal main body portion 81 has a lower surface 83, an upper surface 84, positioned at an opposite side to the lower surface 83, and four side surfaces 85, connecting the lower surface 83 and the upper surface 84. The lower surface 83 of the terminal main body portion 81 is substantially flush with the lower surface 9b of the sealing resin 9 and is exposed from the lower surface 9b. That is, the lower surface 83 of the terminal main body portion 81 constitutes a first exposed surface of the common source terminal 8. In bottom view (plan view), the terminal main body portion 81 is disposed at a front side central portion of the lower surface 9b of the sealing resin 9 in an orientation where four sides of the lower surface 83 of the terminal main body portion 81 are substantially parallel to the four sides of the lower surface 9b of the sealing resin 9.

Among the four side surfaces 85 of the terminal main body portion 81, the front side surface has a first side surface portion 86, a second side surface portion 88, and a joining portion 87. The first side surface portion 86 is continuous to the lower surface 83 and extends substantially perpendicularly toward the upper surface 84. The second side surface portion 88 is continuous to the upper surface 84 and extends substantially perpendicularly toward the lower surface 83. The first side surface portion 86 protrudes further outward in a side direction (direction orthogonal to the vertical direction) than the second side surface portion 88. The joining portion 87 extends from the second side surface portion 88 toward the first side surface portion 86 while expanding outward gradually in the side direction and connects the second side surface portion 88 and the first side surface portion 86.

The first side surface portion 86 of the terminal main body portion 81 is substantially flush with the front side surface 9c of the sealing resin 9 and is exposed from the front side surface 9c. That is, the first side surface portion 86 of the front side surface of the terminal main body portion 81 constitutes a second exposed surface of the common source terminal 8 that is continuous to the first exposed surface. An angle portion formed by intersection of the first side surface portion 86 of the terminal main body portion 81 and the lower surface 83 is also exposed from the sealing resin 9.

The terminal detachment restraining portion 82 is formed such as to protrude rearward from the rear side surface of the terminal main body portion 81. The terminal detachment restraining portion 82 is formed to be thinner than the terminal main body portion 81. An upper surface of the terminal detachment restraining portion 82 is flush with the upper surface 84 of the terminal main body portion 81. One ends of the first bonding wire 11 and the third bonding wire 13 are connected to the upper surface of the common source terminal 8 (including the upper surface 84 of the terminal main body portion 81 and the upper surface of the terminal detachment restraining portion 82).

A solder plating layer (not shown), arranged to increase solder wettability, is formed on the lower surface 83 of the terminal main body portion 81 exposed from the lower surface 9b of the sealing resin 9 and the first side surface portion 86 exposed from the front side surface 9c of the sealing resin 9.

In a state where the respective terminals 4, 5, 6, 7, and 8 are resin-sealed together with the first semiconductor chip 2 and the second semiconductor chip 3, the sealing resin 9 extends around to below the respective terminal detachment restraining portions 42, 52, 62, 72, and 82, thus preventing detachment of the respective terminals 4, 5, 6, 7, and 8 from the sealing resin 9.

Referring to FIG. 7, the lower surface 9b of the sealing resin 9 has a front side 10c, a left side 10d, a rear side 10e, and a right side 10f corresponding respectively to the front side surface 9c, the left side surface 9d, the rear side surface 9e, and the right side surface 9f. In the present preferred embodiment, a shape and size of the lower surface 43 of the first drain terminal 4 and a shape and size of the lower surface 63 of the second drain terminal 6 are substantially equal. Also, a shape and size of the lower surface 53 of the first gate terminal 5 and a shape and size of the lower surface 73 of the second gate terminal 7 are substantially equal.

Let a length of the front side 10c (rear side 10e) of the lower surface 9b of the sealing resin 9 be L and a length of the left side 10d (right side 10f) be W. With each of the lower surface 43 of the first drain terminal 4 and the lower surface 63 of the second drain terminal 6, let a length of a side parallel to the front side 10c of the lower surface 9b be LD1 and a length of a side parallel to the left side 10d of the lower surface 9b be LD2.

With each of the lower surface 53 of the first gate terminal 5 and the lower surface 73 of the second gate terminal 7, let a length of a side parallel to the front side 10c of the lower surface of the sealing resin 9 be LG1 and a length of a side parallel to the left side 10d of the lower surface of the sealing resin 9 be LG2. With the lower surface 83 of the common source terminal 8, let a length of a side parallel to the front side 10c of the lower surface of the sealing resin 9 be LS1 and a length of a side parallel to the left side 10d of the lower surface of the sealing resin 9 be LS2.

Let an interval between the lower surface 43 of the first drain terminal 4 and the lower surface 63 of the second drain terminal 6 in a direction along the rear side 10e of the lower surface of the sealing resin 9 be d1. Let an interval between the lower surface 53 of the first gate terminal 5 and the lower surface 83 of the common source terminal 8 in a direction along the front side 10c of the lower surface of the sealing resin 9 be d2. Let an interval between the lower surface 73 of the second gate terminal 7 and the lower surface 83 of the common source terminal 8 in the direction along the front side 10c of the lower surface of the sealing resin 9 be d3. Let an interval between the lower surface 43 of the first drain terminal 4 and the lower surface 53 of the first gate terminal 5 in a direction along the left side 10d of the lower surface of the sealing resin 9 be d4. Let an interval between the lower surface 63 of the second drain terminal 6 and the lower surface 73 of the second gate terminal 7 in a direction along the right side 10f of the lower surface of the sealing resin 9 be d5.

The semiconductor device 1 preferably satisfies the following formulae (1) and (2).

$$d1=d2=d3=d4=d5 \quad (1)$$

$$LS2=LG2 \quad (2)$$

The semiconductor device 1 preferably further satisfies the following formulae (3), (4), (5), and (6).

$$LS1=d1 \quad (3)$$

$$LD2=LD1 \quad (4)$$

$$LG2=LG1 \quad (5)$$

$$LD1>LG1 \quad (6)$$

In the present preferred embodiment, LD1, LD2, LS1, LS2, LG1, LG2, LS1, LS2, and d1 to d5 are set to satisfy the formulae (1) to (6).

Specifically, in the present preferred embodiment, LD1, LD2, LS1, LS2, LG1, LG2, LS1, LS2, and d1 to d5 are set to the following lengths.

$$LD1=LD2=0.3 \text{ mm}$$

$$LG1=LG2=LS2=0.1 \text{ mm}$$

$$d1=d2=d3=d4=d5=LS1=0.2 \text{ mm}$$

For efficient dissipation of the heat of the semiconductor chips 2 and 3, it is better for areas of the lower surfaces 43 and 63 of the drain terminals 4 and 6 to be larger. However if the areas of the lower surfaces 43 and 63 of the drain terminals 4 and 6 are increased, the semiconductor device 1 increases in size. In the present preferred embodiment, to miniaturize the semiconductor device 1, sizes of the lower surfaces 43 and 63 of the drain terminals 4 and 6 are set to the minimum necessary sizes for heat dissipation of the semiconductor chips 2 and 3. Specifically, the lengths LD1 and LD2 of the sides of the lower surfaces 43 and 63 of the drain terminals 4 and 6 are set to 0.3 mm.

The one ends of the bonding wires 12 and 14 are connected to the upper surfaces 54 and 74 of the gate terminals 5 and 7. In the present preferred embodiment, in order to miniaturize the semiconductor device 1, sizes of the upper surfaces 54 and 74 of the gate terminals 5 and 7 are set to the minimum necessary sizes for connecting the one ends of the bonding wires 12 and 14. Specifically, the sizes of the upper surfaces 54 and 74 of the gate terminals 5 and 7 are set to 0.1 mm×0.1 mm. Accordingly, the lengths LG1 and LG2 of the sides of the upper surfaces 54 and 74 of the gate terminals 5 and 7 are set to 0.1 mm.

As shall be described below, in mounting the semiconductor device 1 on a mounting substrate 201 (see FIG. 12 and FIG. 13), the lower surfaces 43, 53, 63, 73, and 83 of the respective terminals 4, 5, 6, 7, and 8 are coated with solder 211. In this process, a measure must be taken to prevent mutual contact of the solder coated on the lower surfaces of the terminals 4 to 8 that are adjacent. In the present preferred embodiment, in order to miniaturize the semiconductor device 1, the intervals between the terminals 4 to 8 that are adjacent are set to the minimum necessary intervals for preventing mutual contact of the solder coated on the terminals 4 to 8 that are adjacent. Specifically, the intervals d1 to d5 between the terminals 4 to 8 that are adjacent are set to 0.2 mm.

To acquire such intervals d1 to d5, the lengths LS1 and LS2 of the two mutually adjacent sides of the lower surface 83 of the common source terminal 8 are set to 0.2 mm and 0.1 mm, respectively.

That is, in the present preferred embodiment, the length L of the semiconductor device 1 is 0.8 mm (=0.3 mm+0.2 mm+0.3 mm). The width W of the semiconductor device 1 is 0.6 mm (=0.1 mm+0.2 mm+0.3 mm). A height H (see FIG. 5 and FIG. 6) of the semiconductor device 1 is 0.36 mm. Also, a height h (see FIG. 5 and FIG. 6) of each of the first side surface portions 46, 56, 66, 76, and 86 of the respective terminals 4, 5, 6, 7, and 8 exposed from the side surfaces 9c to 9f of the sealing resin 9 is 0.06 mm. The abovementioned dimensions of the respective portions are but an example and are not restricted thereto.

In the present preferred embodiment, a sum of the area of the lower surface 43 of the first drain terminal 4 and the area of the lower surface 63 of the second drain terminal 6 is $0.3*0.3+0.3*0.3+0.3*0.3=0.18$ mm$^2$. The total sum of the areas of the lower surfaces of the drain terminals 4 and 6 is $3/8$ (=$18/48$) of an area of an entirety of a lower surface of the semiconductor device 1. Also, a total sum of the areas of the lower surfaces of the metal terminals (the drain terminals 4 and 6, the gate terminals 5 and 7, and the common source terminal 8) is $11/24$ (=(18+1+1+2)/48) of the area of the entirety of the lower surface of the semiconductor device 1. A heat dissipation property is thus satisfactory with the semiconductor device 1 of the present preferred embodiment.

Also, the areas of the bottom surfaces 43 and 63 of the drain terminals 4 and 6 may be made even smaller to further prevent the mutual contact of solder. For example, it may be arranged such that LD2=0.2 mm and LD1=0.3 mm or LD2=0.3 mm and LD1=0.2 mm. In such case, the total sum of the areas of the lower surfaces 43 and 63 of the drain terminals 4 and 6 is $1/4$ (=$12/48$) of the area of the entirety of the lower surface of the semiconductor device 1 and the total sum of the areas of the lower surfaces of the metal terminals (the drain terminals 4 and 6, the gate terminals 5 and 7, and the common source terminal 8) is ⅓ (=(12+1+1+2)/48) of the area of the entirety of the lower surface of the semiconductor device 1.

That is, from the standpoint of heat dissipation property, it is preferable for the total sum of the areas of the lower surfaces 43 and 63 of the drain terminals 4 and 6 to be ¼ to ⅜ of the area of the entirety of the lower surface of the semiconductor device 1. Also preferably, the total sum of the areas of the lower surfaces of the metal terminals (the drain terminals 4 and 6, the gate terminals 5 and 7, and the common source terminal 8) is ⅓ to ¹¹⁄₂₄ of the area of the entirety of the lower surface of the semiconductor device 1.

Figure 12:
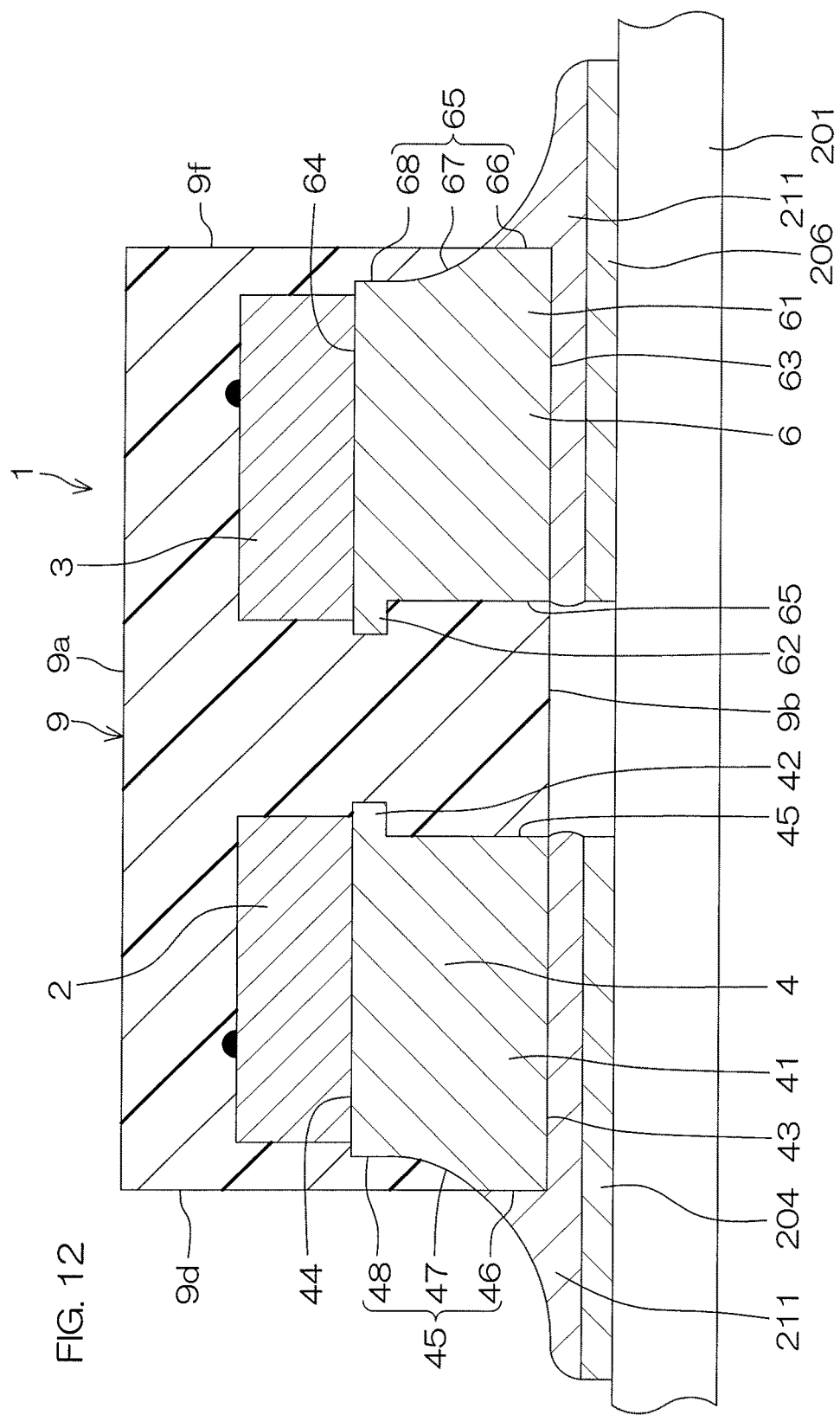
FIG. 12 is a sectional view, corresponding to the sectional view of FIG. 9, of a mounted state of the semiconductor device of FIG. 1.
Figure 13:
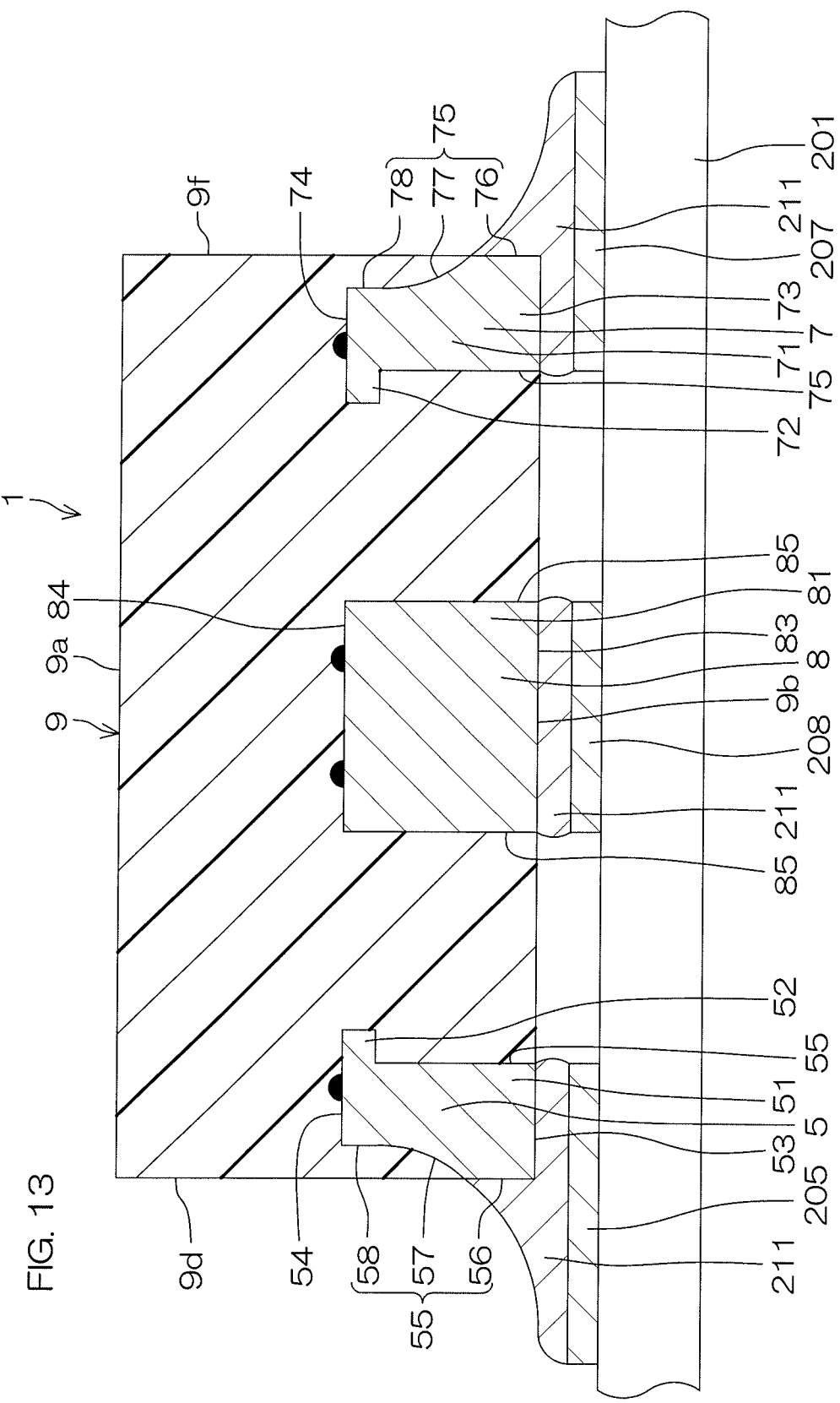
FIG. 13 is a sectional view, corresponding to the sectional view of FIG. 10, of the mounted state of the semiconductor device of FIG. 1.

FIG. 12 and FIG. 13 are illustrative sectional views of a mounted state of the semiconductor device 1. FIG. 12 is a sectional view corresponding to FIG. 9, and FIG. 13 is a sectional view corresponding to FIG. 10.

The semiconductor device 1 is mounted on a surface of the mounting substrate (wiring substrate) 201. A first drain terminal land 204, a first gate terminal land 205, a second drain terminal land 206, a second gate terminal land 207, and a common source terminal land 208 are formed on the surface 202 of the mounting substrate 201.

To mount the semiconductor device 1 on the mounting substrate 201, first, the solder 211 that is creamy is coated on surfaces of the respective lands 204 to 208 on the mounting substrate 201. Next, the semiconductor device 1 is placed on the lands 204 to 208 in an orientation such that the lower surface 43 of the terminal 4, the lower surface 53 of the terminal 5, the lower surface 63 of the terminal 6, the lower surface 73 of the terminal 7, and the lower surface 83 of the terminal 8 of the semiconductor device 1 face the lands 204, 205, 206, 207, and 208, respectively, on the mounting substrate 201.

Next, the semiconductor device 1, in a state of being pressed against the lands 204 to 208 of the mounting substrate 201, is heated for a fixed time and thereafter cooled. The terminals 4, 5, 6, 7, and 8 of the semiconductor device 1 are thereby bonded by the solder 211 to the lands 204, 205, 206, 207, and 208, respectively, on the mounting substrate 201.

The plating layers for increasing solder wettability are formed on the lower surfaces 43, 53, 63, 73, and 83 and the first side surface portions 46, 56, 66, 76, and 86 of the respective terminals 4, 5, 6, 7, and 8. Therefore when the lower surfaces 43, 53, 63, 73, and 83 of the respective terminals 4, 5, 6, 7, and 8 become bonded to the cream solder 211 on the respective lands 204, 205, 206, 207, and 208, the cream solder 211 closely adheres, so as to creep up, to the first side surface portions 46, 56, 66, 76, and 86 of the respective terminals 4, 5, 6, 7, and 8. Consequently, a mounting strength of the semiconductor device 1 and the mounting substrate 201 can be improved and connection reliability can be improved.

Also, so-called solder fillets are thereby formed on the first side surface portions 46, 56, 66, 76, and 86 of the respective terminals 4, 5, 6, 7, and 8 and therefore bonding (soldering) states of the respective terminals 4, 5, 6, 7, and 8 and the respective lands 204, 205, 206, 207, and 208 can be readily inspected visually.

With the semiconductor device 1 according to the first preferred embodiment described above, the source electrode of the first semiconductor chip 2 and the source electrode of the second semiconductor chip 3 are electrically connected to the common source terminal 8. Therefore there is no need to connect a source terminal of the first semiconductor chip 2 and a source terminal of the second semiconductor chip 3 at an exterior of the semiconductor device 1 in using the semiconductor device 1 as a bidirectional switch.

Also with the semiconductor device according to the first preferred embodiment described above, the respective terminals 4, 5, 6, 7, and 8 have the lower surfaces (first exposed surfaces) 43, 53, 63, 73, and 83 that are substantially flush with the lower surface 9b of the sealing resin 9 and are exposed from the lower surface 9b of the sealing resin 9, and therefore miniaturization can be achieved in comparison to a semiconductor device having lead terminals projecting from an outer surface of the sealing resin 9.

Also with the semiconductor device 1 according to the first preferred embodiment described above, the respective terminals 4, 5, 6, 7, and 8 have the first side surface portions (second exposed surfaces) 46, 56, 66, 76, and 86 that are exposed from the side surfaces 9c to 9f of the sealing resin 9 and therefore confirmation of the bonding states (mounting properties) of the respective terminals 4, 5, 6, 7, and 8 and the respective lands 204, 205, 206, 207, and 208 is made easy.

Although with the first preferred embodiment described above, the respective terminals 4, 5, 6, 7, and 8 have the first side surface portions (second exposed surfaces) 46, 56, 66, 76, and 86 that are exposed from the side surfaces 9c to 9f of the sealing resin 9, such exposed surfaces 46, 56, 66, 76, and 86 do not have to be provided.

Also although with the first preferred embodiment described above, the respective terminals 4, 5, 6, 7, and 8 have the lower surfaces (first exposed surfaces) 43, 53, 63, 73, and 83 that are exposed from the lower surface 9b of the sealing resin 9, the respective terminals 4 to 8 may have, in place of such exposed surfaces, upper surfaces that are substantially flush with the upper surface 9a of the sealing resin 9 and are exposed from the upper surface 9a of the sealing resin 9.

Also, the first and second drain terminals 4 and 6 may have exposed surfaces exposed from one surface among the upper surface 9a and the lower surface 9b of the sealing resin 9, and the first gate terminal 5, the second gate terminal 7, and the common source terminal 8 may have exposed surfaces exposed from the other surface among the upper surface 9a and the lower surface 9b of the sealing resin 9.

Figure 16:
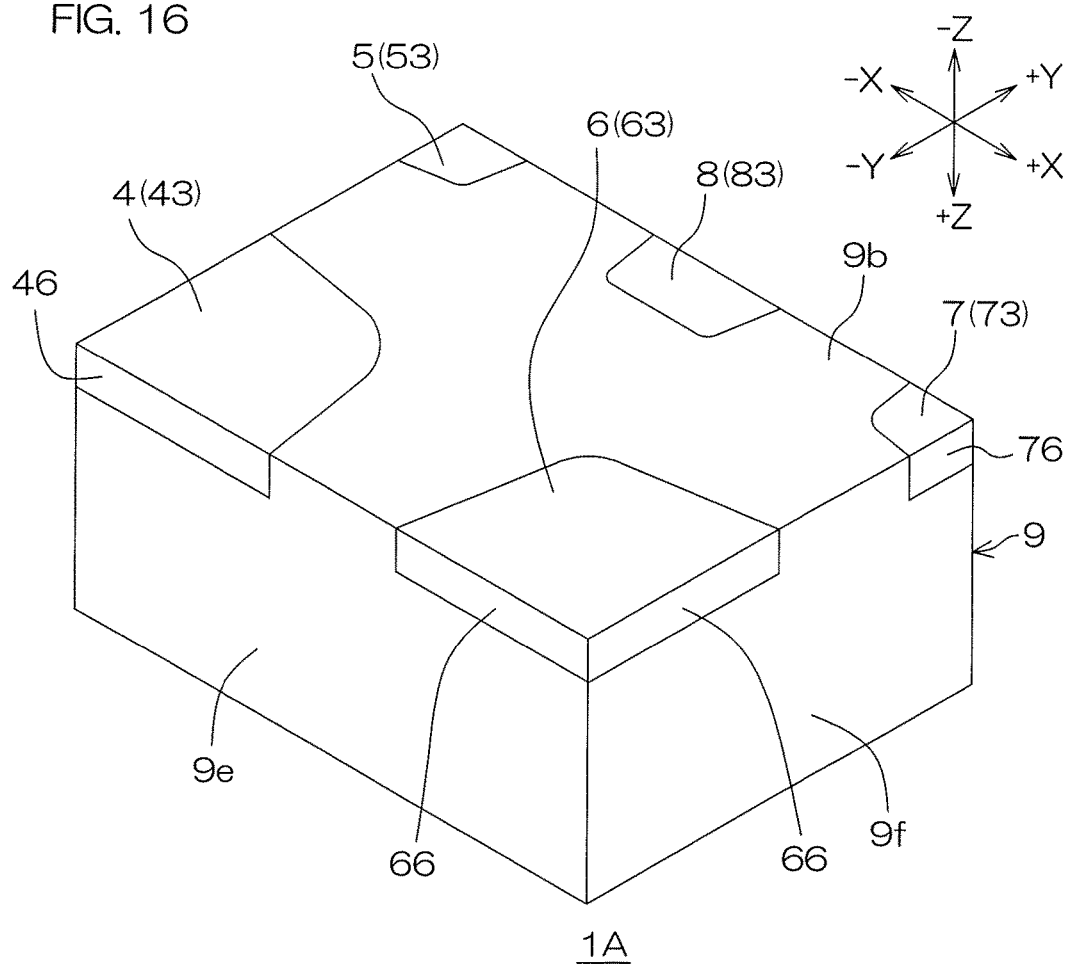
FIG. 16 is an illustrative perspective view of a semiconductor device according to a second preferred embodiment of the present invention.
Figure 17:
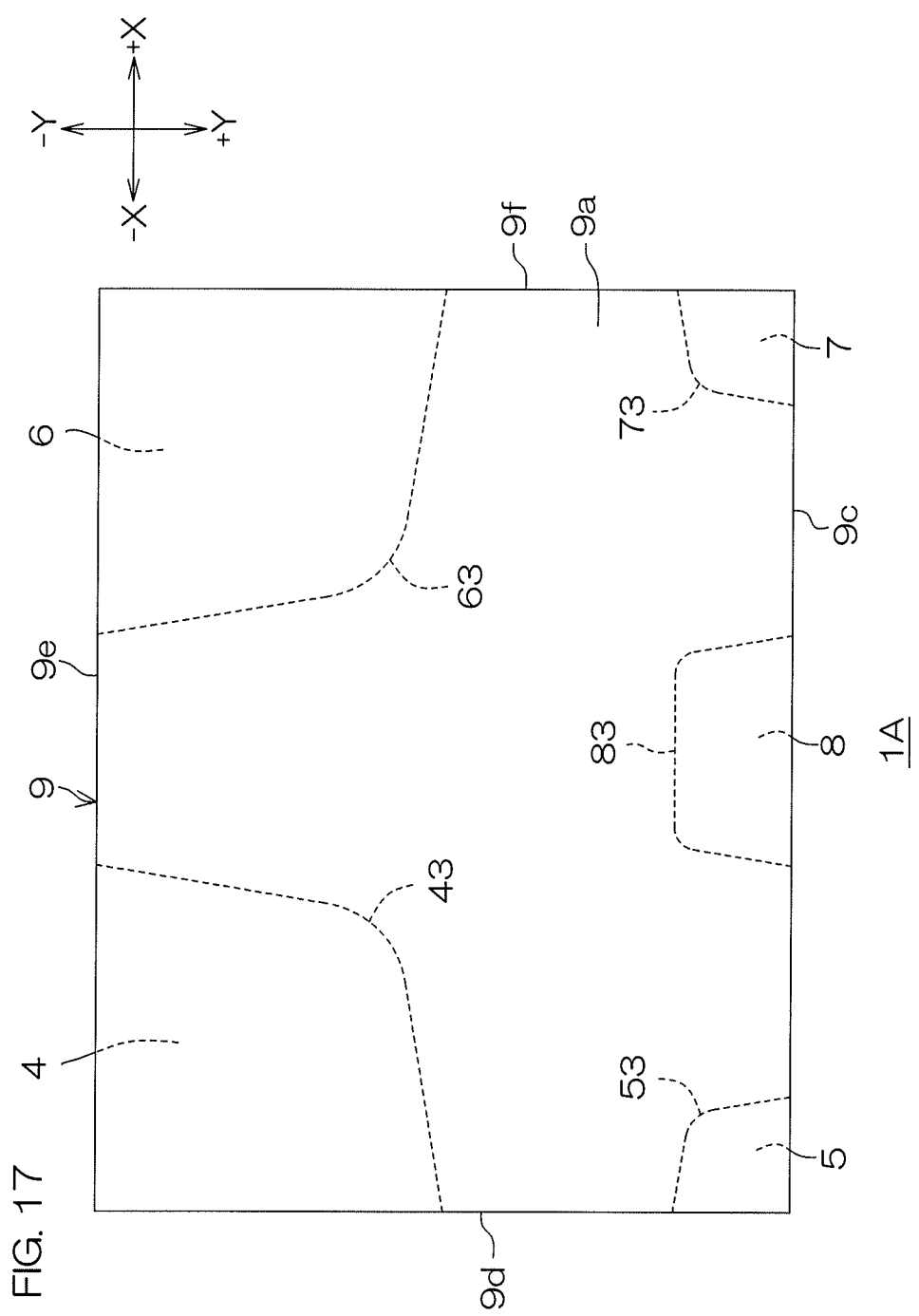
FIG. 17 is an illustrative plan view of FIG. 16.
Figure 18:
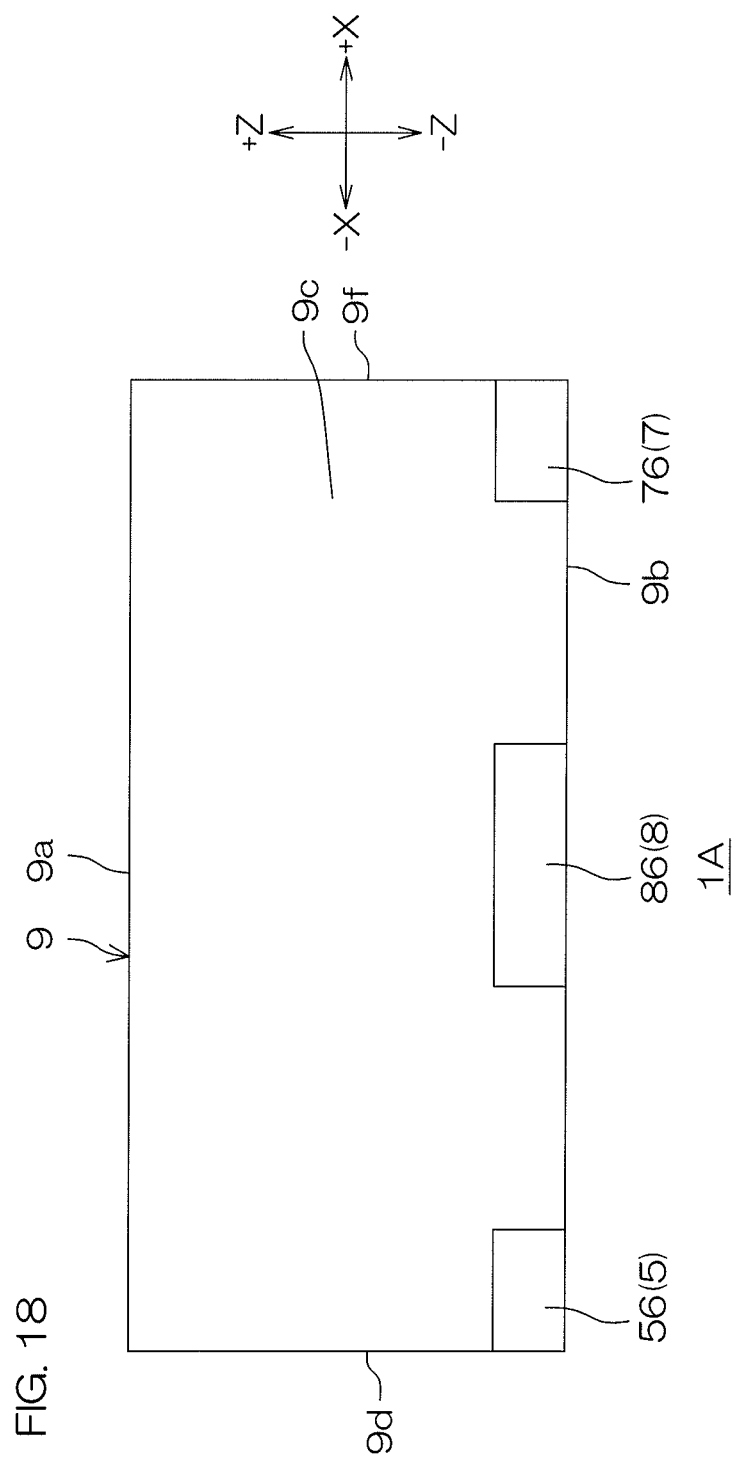
FIG. 18 is an illustrative front view of FIG. 16.
Figure 19:
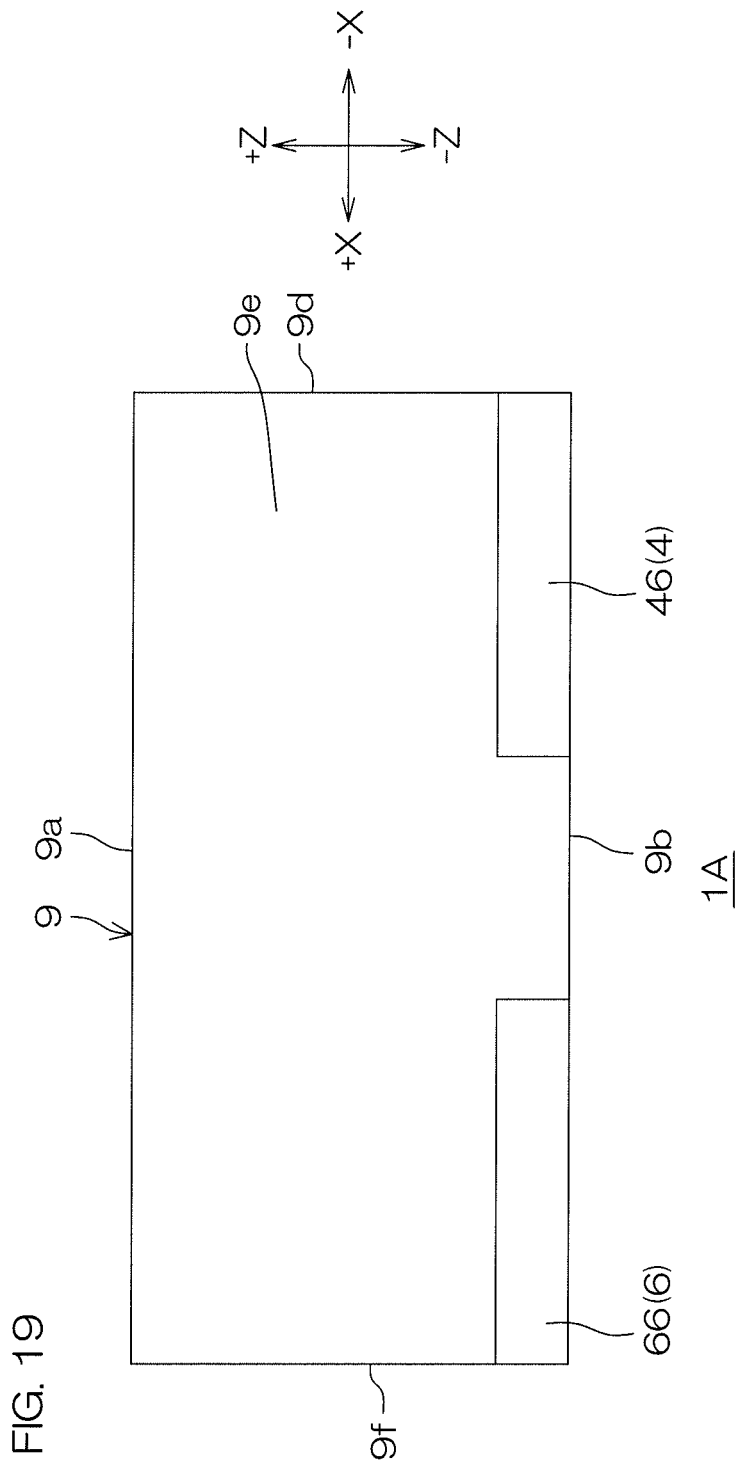
FIG. 19 is an illustrative rear view of FIG. 16.
Figure 20:
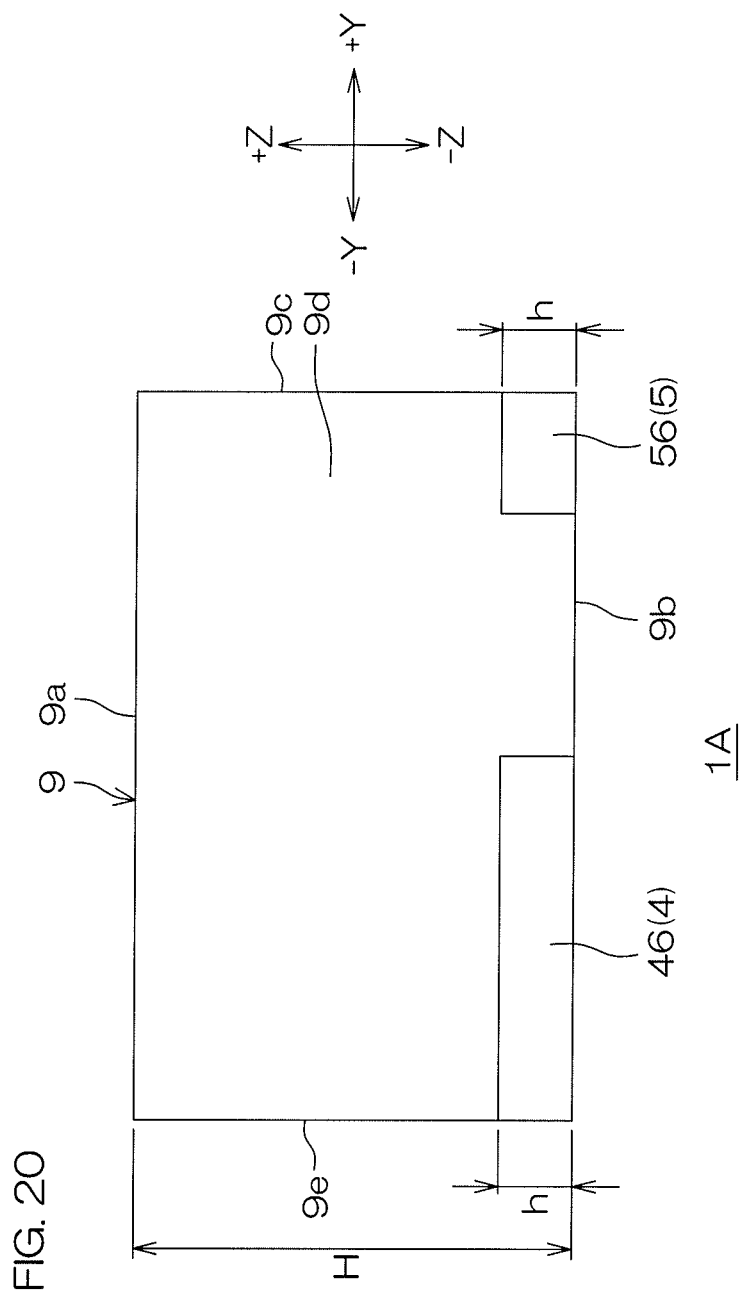
FIG. 20 is an illustrative left side view of FIG. 16.
Figure 21:
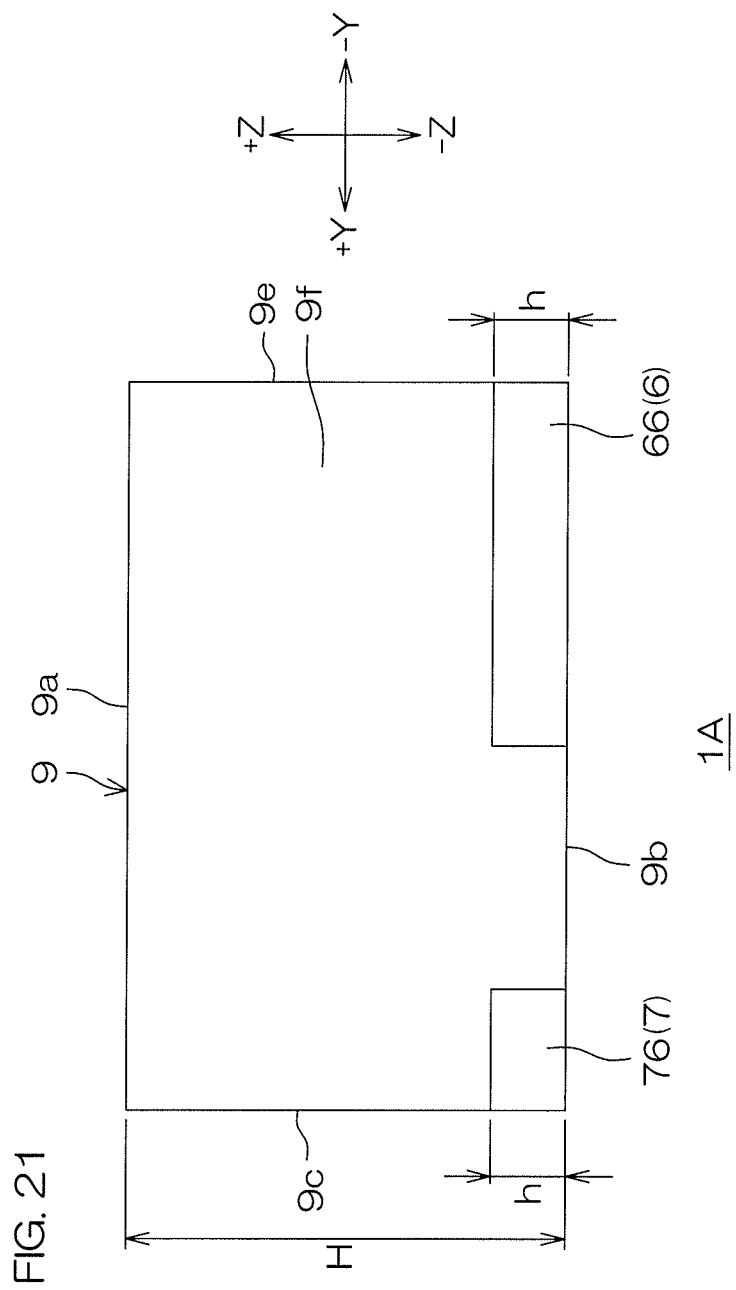
FIG. 21 is an illustrative right side view of FIG. 16.
Figure 22:
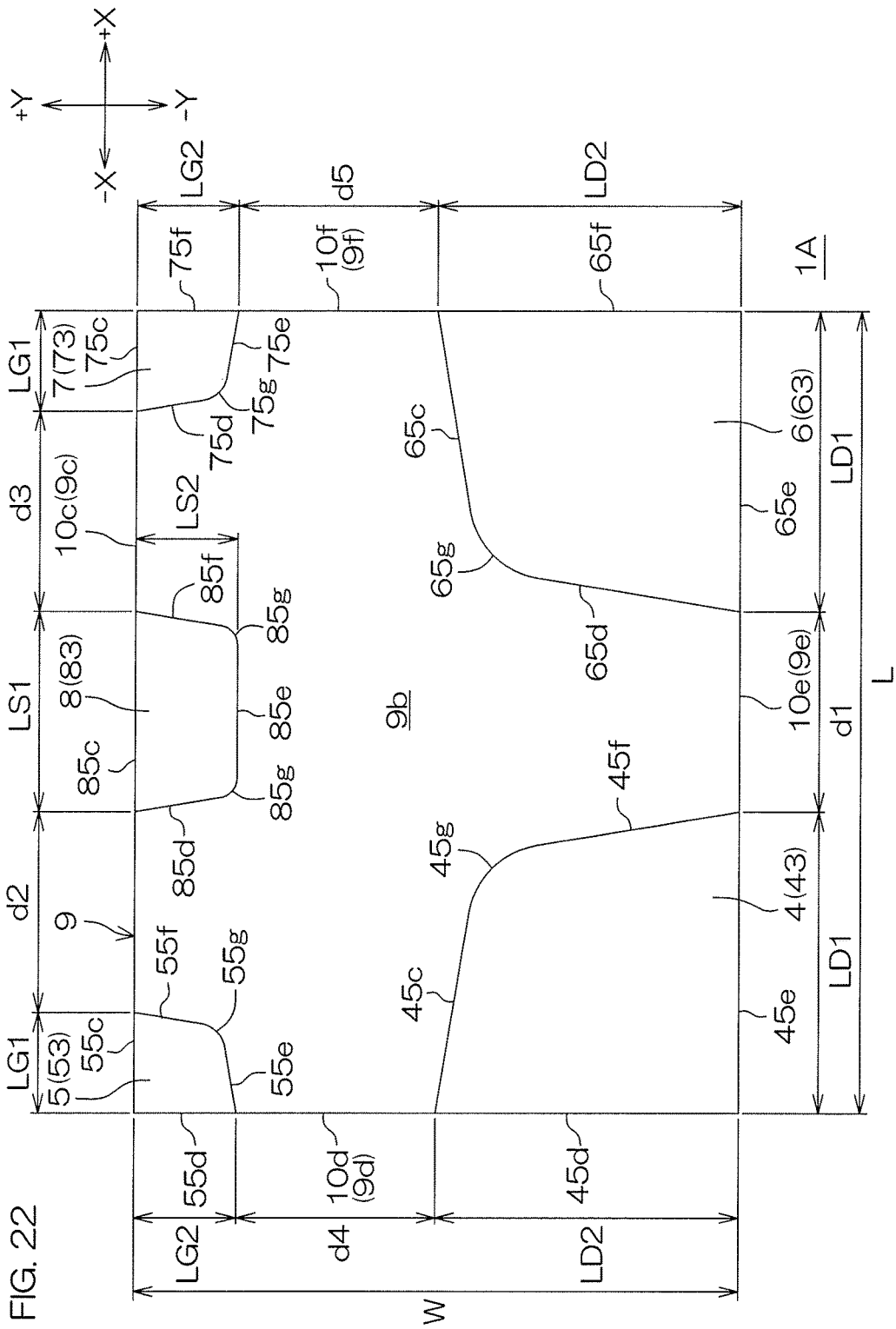
FIG. 22 is an illustrative bottom view of FIG. 16.
Figure 23:
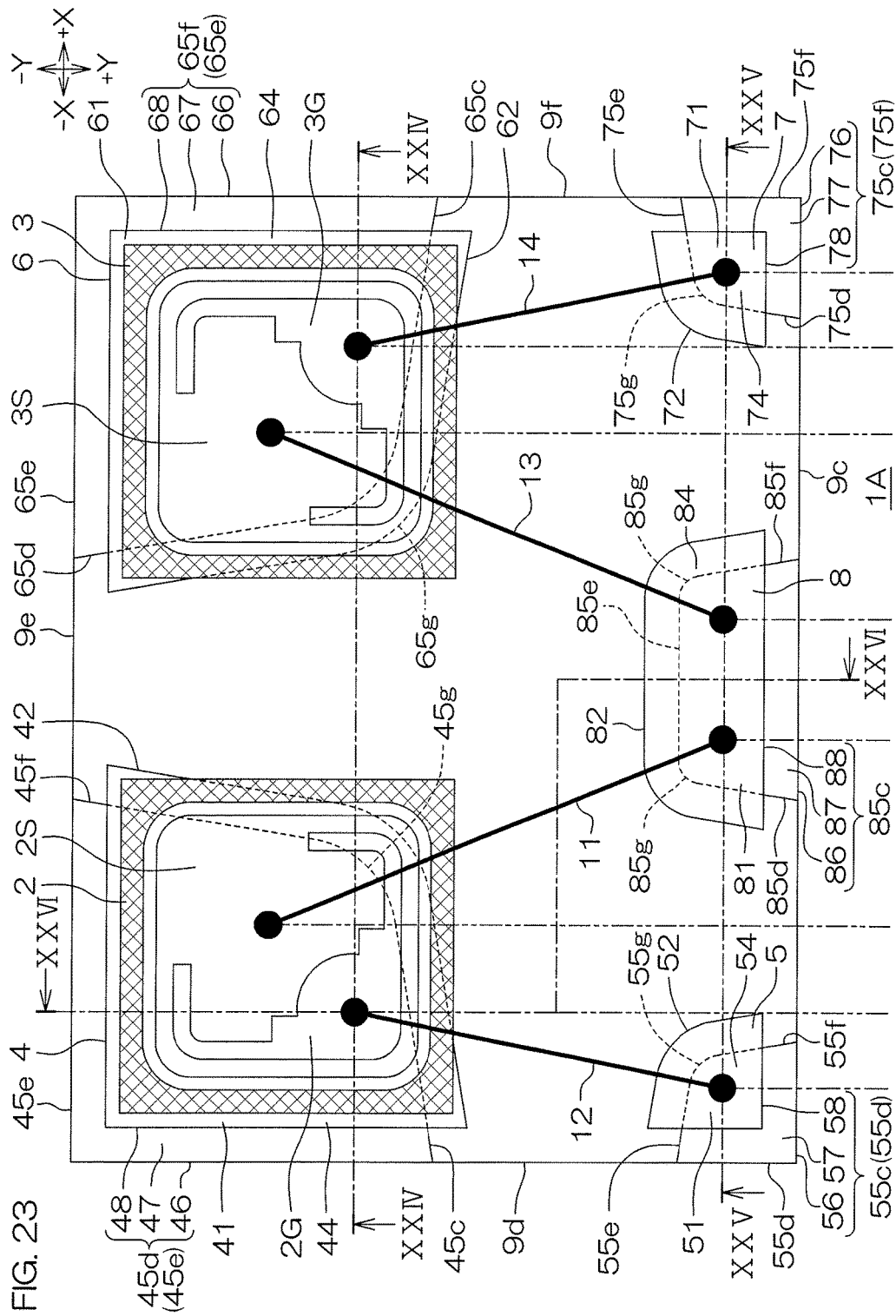
FIG. 23 is a plan view of an internal structure.
Figure 24:
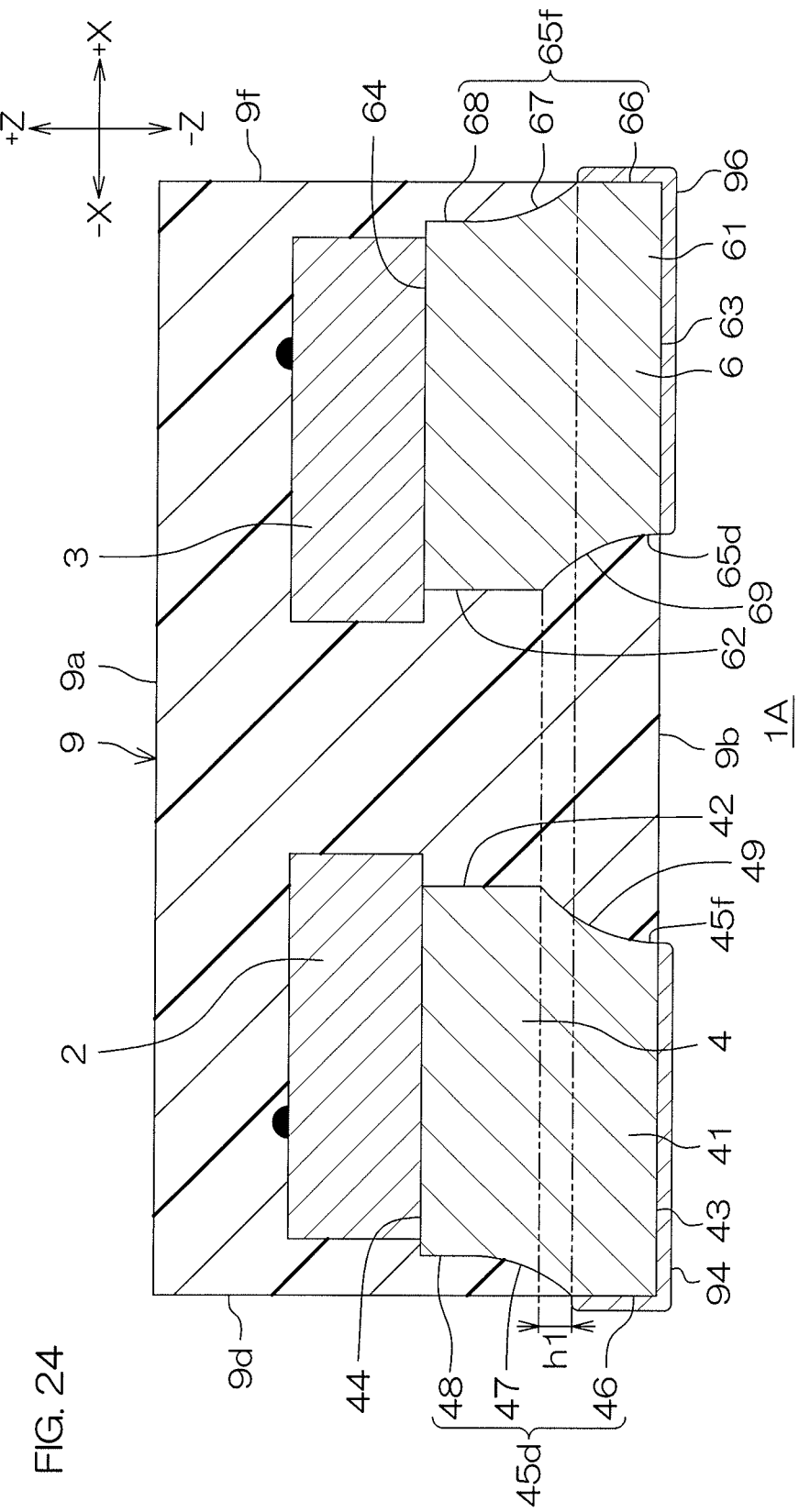
FIG. 24 is a sectional view taken along line XXIV-XXIV of FIG. 23.
Figure 25:
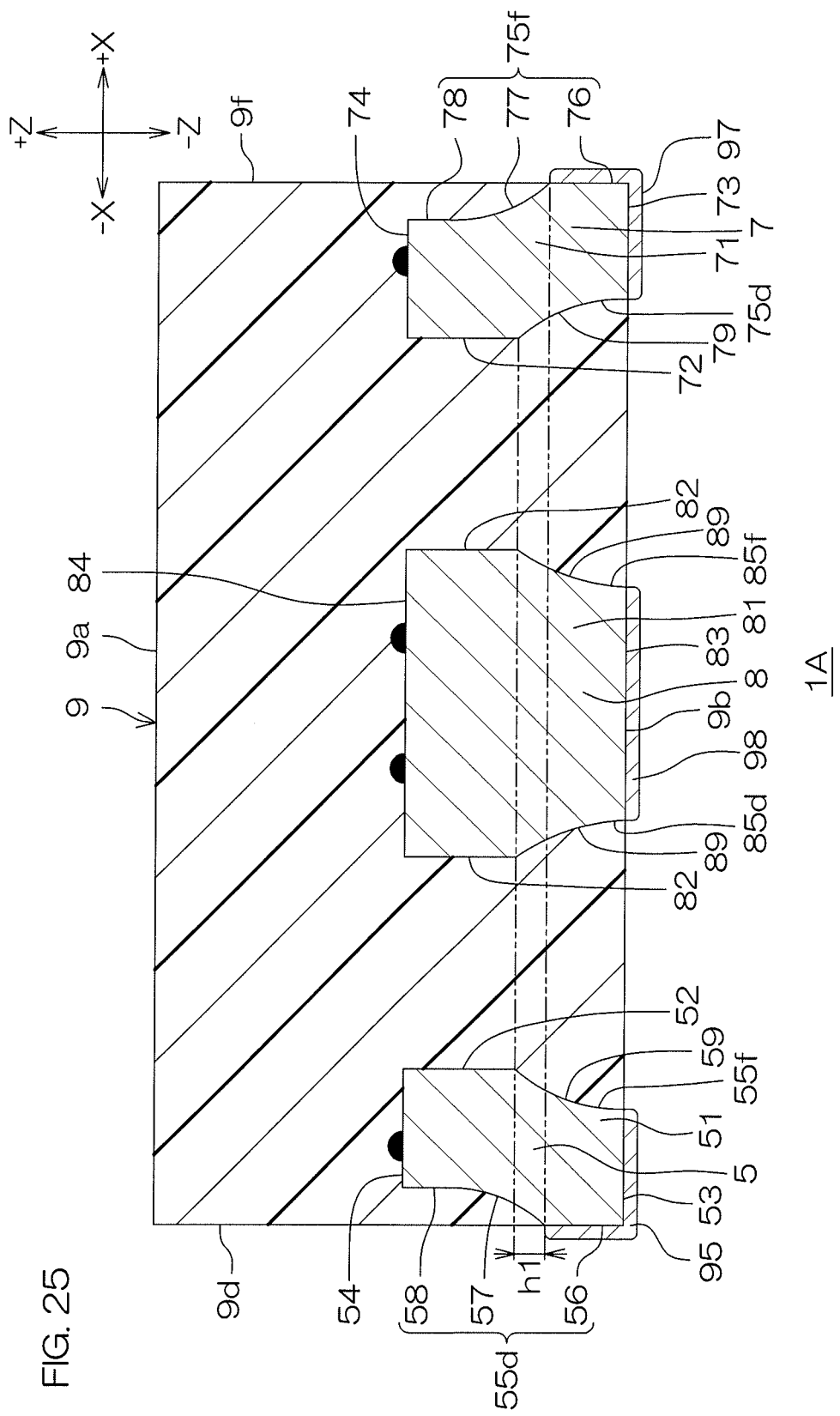
FIG. 25 is a sectional view taken along line XXV-XXV of FIG. 23.
Figure 26:
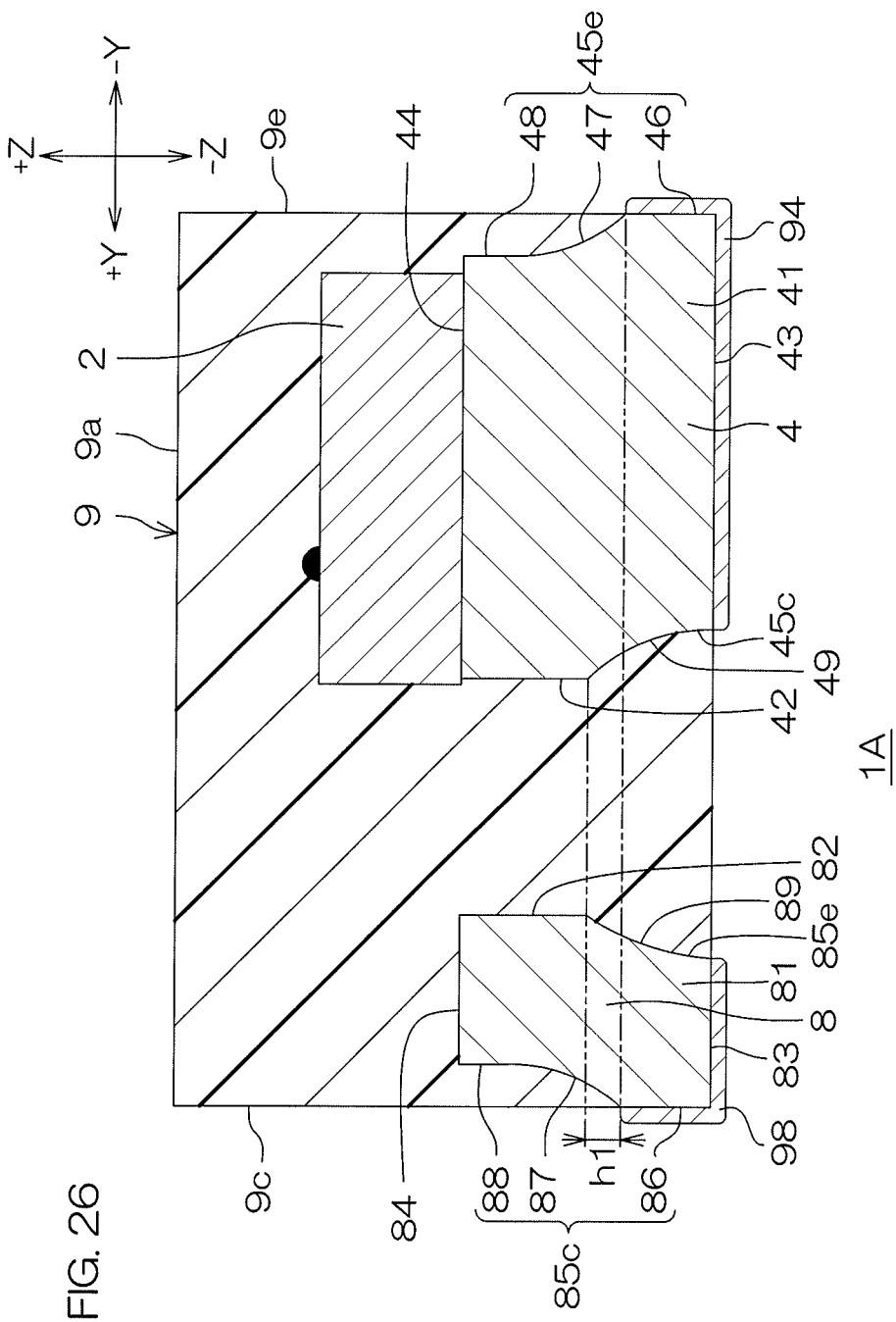
FIG. 26 is a sectional view taken along line XXVI-XXVI of FIG. 23.

FIG. 16 is an illustrative perspective view of a semiconductor device according to a second preferred embodiment of the present invention. FIG. 17 is an illustrative plan view of FIG. 16. FIG. 18 is an illustrative front view of FIG. 16. FIG. 19 is an illustrative rear view of FIG. 16. FIG. 20 is an illustrative left side view of FIG. 16. FIG. 21 is an illustrative right side view of FIG. 16. FIG. 22 is an illustrative bottom view of FIG. 16. FIG. 23 is a plan view of an internal structure. FIG. 24 is a sectional view taken along line XXIV-XXIV of FIG. 23. FIG. 25 is a sectional view taken along line XXV-XXV of FIG. 23. FIG. 26 is a sectional view taken along line XXVI-XXVI of FIG. 23.

As with the semiconductor device 1 according to the first preferred embodiment, the semiconductor device 1A shown in FIG. 16 to FIG. 26 is a device arranged to realize the bidirectional switch 100 represented by the electric circuit such as shown in FIG. 14.

The semiconductor device 1A shall now be described in detail with reference to FIG. 16 to FIG. 26. The semiconductor device 1A has a substantially oblong shape in plan view. For convenience of description, a +X direction, a −X direction, a +Y direction, a −Y direction, a +Z direction, and a −Z direction, shown in FIG. 16, may be used below. The +X direction and the −X direction are two directions along a long side of the semiconductor device 1A in plan view and these shall be referred to simply as the "X direction" when referred to collectively. The +Y direction and the −Y direction are two directions along a short side of the semiconductor device 1A in plan view and these shall be referred to simply as the "Y direction" when referred to collectively.

The +Z direction and the −Z direction are two directions perpendicular to a surface of the semiconductor device 1A in plan view and these shall be referred to simply as the "Z direction" when referred to collectively. A +Z direction side surface of the semiconductor device 1A may be referred to as an upper surface, and a −Z direction side surface of the semiconductor device 1A may be referred to as a lower surface or a bottom surface. FIG. 16 shows an appearance of the semiconductor device 1A in a state where the lower surface (−Z direction side surface) is disposed to face upward.

Mainly referring to FIG. 16 and FIG. 23 to FIG. 26, the semiconductor device 1A includes a first semiconductor chip 2, functioning as the first MOSFET 101 of FIG. 14, and a second semiconductor chip 3, functioning as the second MOSFET 102 of FIG. 14. The semiconductor device 1A also includes the first drain terminal 4, the first gate terminal 5, the second drain terminal 6, the second gate terminal 7, the common source terminal 8, first to fourth bonding wires (metal connecting members) 11 to 14, and a sealing resin 9.

A large difference between the semiconductor device 1A according to the second preferred embodiment and the semiconductor device 1 according to the first preferred embodiment is that the shapes of the first drain terminal 4, the first gate terminal 5, the second drain terminal 6, the second gate terminal 7, and the common source terminal 8 are different.

The first semiconductor chip 2 is die-bonded on the first drain terminal 4 in a state where a surface (device forming surface), at a side at which a functional element is formed, is faced in the +Z direction. A drain electrode is formed at a bottom surface (lower surface) of the first semiconductor chip 2. The drain electrode of the first semiconductor chip 2 is mechanically and electrically connected to an upper surface (+Z direction side surface) of the first drain terminal 4.

A source electrode (source pad) 2S and a gate electrode (gate pad) 2G (see FIG. 23) are formed on an upper surface of the first semiconductor chip 2. The source electrode 2S is connected to the common source terminal 8 by the bonding wire 11. The gate electrode 2G is connected to the first gate terminal 5 by the bonding wire 12.

The second semiconductor chip 3 is die-bonded on the second drain terminal 6 in a state where a surface (device forming surface), at a side at which a functional element is formed, is faced upward. A drain electrode is formed at a bottom surface (lower surface) of the second semiconductor chip 3. The drain electrode of the second semiconductor chip 3 is mechanically and electrically connected to an upper surface (+Z direction side surface) of the second drain terminal 6.

A source electrode (source pad) 3S and a gate electrode (gate pad) 3G (see FIG. 23) are formed on an upper surface of the second semiconductor chip 3. The source electrode 3S is connected to the common source terminal 8 by the bonding wire 13. The gate electrode 3G is connected to the second gate terminal 7 by the bonding wire 14. The respective terminals 4 to 8 are formed from metal thin plates constituted of copper or an alloy that contains copper.

The sealing resin 9 is constituted, for example, of an epoxy resin. As shown in FIG. 16, the sealing resin 9 is formed, for example, to a rectangular parallelepiped shape that is flat in the Z direction. The Z direction is synonymous to a thickness direction of the semiconductor device 1A. The sealing resin 9 of rectangular parallelepiped shape has an upper surface 9a, constituting a +Z direction side surface, a lower surface 9b, constituting a −Z direction side surface, and side surfaces 9c to 9f extending in substantially perpendicular directions with respect to the upper surface 9a and the lower surface 9b. The upper surface 9a and the lower surface 9b are both flat surfaces.

The upper surface 9a and the lower surface 9b are formed to rectangular shapes that are long in the X direction in plan view. The side surfaces 9c to 9f are continuous to the upper surface 9a and the lower surface 9b. In detail, the side surfaces 9c to 9f are formed over an entire periphery, excluding the upper surface 9a and the lower surface 9b, of the semiconductor device 1A. In other words, the semiconductor device 1A has the four side surfaces 9c to 9f that are continuous to respective four sides of the upper surface 9a and the lower surface 9b. The four side surfaces 9c to 9f are constituted of the +Y direction side surface 9c, the −X direction side surface 9d, the −Y direction side surface 9e, and the +X direction side surface 9f.

As shown in FIG. 23, when an interior of the sealing resin 9 is viewed from a plane, the first drain terminal 4 is disposed at a corner portion at a −Y direction side and −X direction side and the second drain terminal 6 is disposed at a corner portion at a −Y direction side and +X direction side. Also, the first gate terminal 5 is disposed at a corner portion at a +Y direction side and −X direction side, the second gate terminal 7 is disposed at a corner portion at a +Y direction side and +X direction side, and the common source terminal 8 is disposed at a position between the first gate terminal 5 and the second gate terminal 7.

Referring to FIG. 16, FIG. 17, FIG. 22, FIG. 23, and FIG. 24, the first drain terminal 4 has, integrally, a terminal main body portion 41 of quadratic prism shape having a quadrilateral bottom surface shape, and a terminal detachment restraining portion 42. The terminal main body portion 41 has a lower surface 43, an upper surface 44, positioned at an opposite side to the lower surface 43, and four side surfaces, connecting the lower surface 43 and the upper surface 44. The four side surfaces are constituted of a +Y direction side surface 45c, a −X direction side surface 45d, a −Y direction side surface 45e, and a +X direction side surface 45f.

The −X direction side surface 45d is parallel to the Y direction in plan view. The −Y direction side surface 45e extends in the +X direction from a −Y direction side edge portion of the −X direction side surface 45d in plan view. The +X direction side surface 45f extends in the +Y direction and obliquely toward the −X direction from a +X direction side edge portion of the −Y direction side surface 45e in plan view. The +Y direction side surface 45c extends in the +X direction and obliquely toward the −Y direction from a +Y direction side edge portion of the −X direction side surface 45d and is connected to a +Y direction side edge portion of the +X direction side surface 45f in plan view. A connection portion of the +X direction side surface 45f and the +Y direction side surface 45c is formed to a curved surface 45g projecting outward of the terminal main body portion 41 in plan view.

The lower surface 43 of the terminal main body portion 41 is substantially flush with the lower surface 9b of the sealing resin 9 and is exposed from the lower surface 9b. That is, the lower surface 43 of the terminal main body portion 41 constitutes a first exposed surface of the first drain terminal 4. In bottom view (plan view), the terminal main body portion 41 is disposed at the corner portion at the −Y direction side and −X direction side of the lower surface 9b of the sealing resin 9. More specifically, in bottom view, the terminal main body portion 41 is disposed in an orientation where, two sides, among four sides of the lower surface 43 of the terminal main body portion 41, that correspond to a lower edge of the −X direction side surface 45d and a lower edge of the −Y direction side surface 45e are respectively substantially parallel to two sides, among four sides of the lower surface 9b of the sealing resin 9, that correspond to a lower edge of the −X direction side surface 9d and a lower edge of the −Y direction side surface 9e.

That is, the lower surface (first exposed surface) 43 of the terminal main body portion 41 is, in plan view, of a quadrilateral shape having a first side and a second side matching two sides of the corner portion of the sealing resin 9 at which the lower surface 43 is disposed and having a third side (lower edge of the +X direction side surface 45f) and a fourth side (lower edge of the +Y direction side surface 45c) with one ends connected respectively to the first side and the second side and other ends connected mutually. A connection portion of the third side and the fourth side is formed to a curved shape projecting outward of the lower surface (first exposed surface) 43.

Each of the −X direction side surface 45d and the −Y direction side surface 45e of the terminal main body portion 41 has a first side surface portion 46, a second side surface portion 48, and a joining portion 47. The first side surface portion 46 is continuous to the lower surface 43 and extends substantially perpendicularly toward the upper surface 44. The second side surface portion 48 is continuous to the upper surface 44 and extends substantially perpendicularly toward the lower surface 43. At each of −X direction side surface 45d and the −Y direction side surface 45e of the terminal main body portion 41, the first side surface portion 46 protrudes further outward in a side direction (direction orthogonal to the Z direction) than the second side surface portion 48. At each of the −X direction side surface 45d and the −Y direction side surface 45e of the terminal main body portion 41, the joining portion 47 extends from the second side surface portion 48 toward the first side surface portion 46 while expanding outward gradually in the side direction and connects the second side surface portion 48 and the first side surface portion 46.

The first side surface portion 46 of the −X direction side surface 45d and the first side surface portion 46 of the −Y direction side surface 45e of the terminal main body portion 41 are respectively substantially flush with the −X direction surface 9d and the −Y direction side surface 9e of the sealing resin 9 and are exposed from the −X direction side surface 9d and the −Y direction side surface 9e. That is, the first side surface portion 46 of the −X direction side surface 45d and the first side surface portion 46 of the −Y direction side surface 45e of the terminal main body portion 41 constitute second exposed surfaces of the first drain terminal 4 that are continuous to the first exposed surface. An angle portion formed by intersection of the two first side surface portions 46 of the terminal main body portion 41 and angle portions formed by intersections of the respective first side surface portions 46 and the lower surface 43 are also exposed from the sealing resin 9.

The terminal detachment restraining portion 42 is formed such as to protrude outward in side directions from upper portions of the +X direction side surface 45f and the +Y direction side surface 45c of the terminal main body portion 41. An upper surface of the terminal detachment restraining portion 42 is flush with the upper surface 44 of the terminal main body portion 41.

At the +X direction side surface 45f and the +Y direction side surface 45c of the terminal main body portion 41, a side surface portion 49, between a lower edge of the terminal detachment restraining portion 42 and a lower edge of the terminal main body portion 41, extends while narrowing gradually inward in side directions from the lower edge of the terminal detachment restraining portion 42 to the lower edge of the terminal main body portion 41 and connects the lower edge of the terminal detachment restraining portion 42 and the lower edge of the terminal main body portion 41. A height position of the lower edge of the terminal detachment restraining portion 42 is further to the upper side (+Z direction side) by just h1 than height positions of upper ends of the first side surface portions 46 of the −X direction side surface 45d and the −Y direction side surface 45e of the terminal main body portion 41.

The first semiconductor chip 2 is die-bonded to the upper surface of the first drain terminal 4 (including the upper surface 44 of the terminal main body portion 41 and the upper surface of the terminal detachment restraining portion 42).

A solder plating layer 94, arranged to increase solder wettability, is formed on the lower surface 43 of the terminal main body portion 41 exposed from the lower surface 9b of the sealing resin 9 and the first side surface portions 46 exposed from the −X direction side surface 9d and the −Y direction side surface 9e of the sealing resin 9. In FIG. 16 to FIG. 23, the lead plating layer 94 is omitted for convenience of description.

The second drain terminal 6 has, integrally, a terminal main body portion 61 of quadratic prism shape having a quadrilateral bottom surface shape, and a terminal detachment restraining portion 62. The terminal main body portion 61 has a lower surface 63, an upper surface 64, positioned at an opposite side to the lower surface 63, and four side surfaces, connecting the lower surface 63 and the upper surface 64. The four side surfaces are constituted of a +Y direction side surface 65c, a −X direction side surface 65d, a −Y direction side surface 65e, and a +X direction side surface 65f.

The +X direction side surface 65f is parallel to the Y direction in plan view. The −Y direction side surface 65e extends in the −X direction from a −Y direction side edge portion of the +X direction side surface 65f in plan view. The −X direction side surface 65d extends in the +Y direction and obliquely toward the +X direction from a −X direction side edge portion of the −Y direction side surface 65e in plan view. The +Y direction side surface 65c extends in the −X direction and obliquely toward the −Y direction from a +Y direction side edge portion of the +X direction side surface 65f and is connected to a +Y direction side edge portion of the −X direction side surface 65d in plan view. A connection portion of the −X direction side surface 65d and the +Y direction side surface 65c is formed to a curved surface 65g projecting outward of the terminal main body portion 61 in plan view.

The lower surface 63 of the terminal main body portion 61 is substantially flush with the lower surface 9b of the sealing resin 9 and is exposed from the lower surface 9b. That is, the lower surface 63 of the terminal main body portion 61 constitutes a first exposed surface of the second drain terminal 6. In bottom view (plan view), the terminal main body portion 61 is disposed at the corner portion at the −Y direction side and +X direction side of the lower surface 9b of the sealing resin 9. More specifically, in bottom view, the terminal main body portion 61 is disposed in an orientation where, two sides, among four sides of the lower surface 63 of the terminal main body portion 61, that correspond to a lower edge of the +X direction side surface 65*f* and a lower edge of the −Y direction side surface 65*e* are respectively substantially parallel to two sides, among the four sides of the lower surface 9*b* of the sealing resin 9, that correspond to a lower edge of the +X direction side surface 9*f* and the lower edge of the −Y direction side surface 9*e*.

That is, the lower surface (first exposed surface) 63 of the terminal main body portion 61 is, in plan view, of a quadrilateral shape having a first side and a second side matching two sides of the corner portion of the sealing resin 9 at which the lower surface 63 is disposed and having a third side (lower edge of the +Y direction side surface 65*c*) and a fourth side (lower edge of the −X direction side surface 65*d*) with one ends connected respectively to the first side and the second side and other ends connected mutually. A connection portion of the third side and the fourth side is formed to a curved shape projecting outward of the lower surface (first exposed surface) 63.

Each of the +X direction side surface 65*f* and the −Y direction side surface 65*e* of the terminal main body portion 61 has a first side surface portion 66, a second side surface portion 68, and a joining portion 67. The first side surface portion 66 is continuous to the lower surface 63 and extends substantially perpendicularly toward the upper surface 64. The second side surface portion 68 is continuous to the upper surface 64 and extends substantially perpendicularly toward the lower surface 63. At each of the +X direction side surface 65*f* and the −Y direction side surface 65*e* of the terminal main body portion 61, the first side surface portion 66 protrudes further outward in a side direction (direction orthogonal to the Z direction) than the second side surface portion 68. At each of the +X direction side surface 65*f* and the −Y direction side surface 65*e* of the terminal main body portion 61, the joining portion 67 extends from the second side surface portion 68 toward the first side surface portion 66 while expanding outward gradually in the side direction and connects the second side surface portion 68 and the first side surface portion 66.

The first side surface portion 66 of the +X direction side surface 65*f* and the first side surface portion 66 of the −Y direction side surface 65*e* of the terminal main body portion 61 are respectively substantially flush with the +X direction side surface 9*f* and the −Y direction side surface 9*e* of the sealing resin 9 and are exposed from the +X direction side surface 9*f* and the −Y direction side surface 9*e*. That is, the first side surface portion 66 of the +X direction side surface 65*f* and the first side surface portion 66 of the −Y direction side surface 65*e* of the terminal main body portion 61 constitute second exposed surfaces of the second drain terminal 6 that are continuous to the first exposed surface. An angle portion formed by intersection of the two first side surface portions 66 of the terminal main body portion 61 and angle portions formed by intersections of the respective first side surface portions 66 and the lower surface 63 are also exposed from the sealing resin 9.

The terminal detachment restraining portion 62 is formed such as to protrude outward in side directions from upper portions of the −X direction side surface 65*d* and the +Y direction side surface 65*c* of the terminal main body portion 61. An upper surface of the terminal detachment restraining portion 62 is flush with the upper surface 64 of the terminal main body portion 61.

At the −X direction side surface 65*d* and the +Y direction side surface 65*c* of the terminal main body portion 61, a side surface portion 69, between a lower edge of the terminal detachment restraining portion 62 and a lower edge of the terminal main body portion 61, extends while narrowing gradually inward in side directions from the lower edge of the terminal detachment restraining portion 62 to the lower edge of the terminal main body portion 61 and connects the lower edge of the terminal detachment restraining portion 62 and the lower edge of the terminal main body portion 61. A height position of the lower edge of the terminal detachment restraining portion 62 is further to the upper side (+Z direction side) by just h1 than height positions of upper ends of the first side surface portions 66 of the +X direction side surface 65*f* and the −Y direction side surface 65*e* of the terminal main body portion 61.

The second semiconductor chip 3 is die-bonded to the upper surface of the second drain terminal 6 (including the upper surface 64 of the terminal main body portion 61 and the upper surface of the terminal detachment restraining portion 62).

A solder plating layer 96, arranged to increase solder wettability, is formed on the lower surface 63 of the terminal main body portion 61 exposed from the lower surface 9*b* of the sealing resin 9 and the first side surface portions 66 exposed from the +X direction side surface 9*f* and the −Y direction side surface 9*e* of the sealing resin 9. In FIG. 16 to FIG. 23, the lead plating layer 96 is omitted for convenience of description.

Referring to FIG. 16, FIG. 17, FIG. 22, FIG. 23, and FIG. 25, the first gate terminal 5 has, integrally, a terminal main body portion 51 of quadratic prism shape having a quadrilateral bottom surface shape, and a terminal detachment restraining portion 52. The terminal main body portion 51 has a lower surface 53, an upper surface 54, positioned at an opposite side to the lower surface 53, and four side surfaces, connecting the lower surface 53 and the upper surface 54. The four side surfaces are constituted of a +Y direction side surface 55*c*, a −X direction side surface 55*d*, a −Y direction side surface 55*e*, and a +X direction side surface 55*f*.

The +Y direction side surface 55*c* is parallel to the X direction in plan view. The −X direction side surface 55*d* extends in the −Y direction from a +X direction side edge portion of the +Y direction side surface 55*c* in plan view. The −Y direction side surface 55*e* extends in the +X direction and obliquely toward the +Y direction from a −Y direction side edge portion of the −X direction side surface 55*d* in plan view. The +X direction side surface 55*f* extends in the −Y direction and obliquely toward the −X direction from a +X direction side edge portion of the +Y direction side surface 55*c* and is connected to a +X direction side edge portion of the −Y direction side surface 55*e* in plan view. A connection portion of the +X direction side surface 55*f* and the −Y direction side surface 55*e* is formed to a curved surface 55*g* projecting outward of the terminal main body portion 51 in plan view.

The terminal main body portion 51 has its lower surface 53 exposed from the lower surface 9*b* of the sealing resin 9. The lower surface 53 of the terminal main body portion 51 is substantially flush with the lower surface 9*b* of the sealing resin 9 and is exposed from the lower surface 9*b*. That is, the lower surface 53 of the terminal main body portion 51 constitutes a first exposed surface of the first gate terminal 5. In bottom view (plan view), the terminal main body portion 51 is disposed at the corner portion at the +Y direction side and −X direction side of the lower surface 9*b* of the sealing resin 9. More specifically, in bottom view, the terminal main body portion 51 is disposed in an orientation where, two sides, among four sides of the lower surface 53 of the terminal main body portion 51, that correspond to a lower edge of the −X direction side surface 55*d* and a lower edge of the +Y direction side surface 55c are respectively substantially parallel to two sides, among the four sides of the lower surface 9b of the sealing resin 9, that correspond to the lower edge of the −X direction side surface 9d and a lower edge of the +Y direction side surface 9c.

That is, the lower surface (first exposed surface) 53 of the terminal main body portion 51 is, in plan view, of a quadrilateral shape having a first side and a second side matching two sides of the corner portion of the sealing resin 9 at which the lower surface 53 is disposed and having a third side (lower edge of the +X direction side surface 55f) and a fourth side (lower edge of the −Y direction side surface 55e) with one ends connected respectively to the first side and the second side and other ends connected mutually. A connection portion of the third side and the fourth side is formed to a curved shape projecting outward of the lower surface (first exposed surface) 53.

Each of the −X direction side surface 55d and the +Y direction side surface 55c of the terminal main body portion 51 has a first side surface portion 56, a second side surface portion 58, and a joining portion 57. The first side surface portion 56 is continuous to the lower surface 53 and extends substantially perpendicularly toward the upper surface 54. The second side surface portion 58 is continuous to the upper surface 54 and extends substantially perpendicularly toward the lower surface 53. At each of the −X direction side surface 55d and the +Y direction side surface 55c of the terminal main body portion 51, the first side surface portion 56 protrudes further outward in a side direction (direction orthogonal to the Z direction) than the second side surface portion 58. At each of the −X direction side surface 55d and the +Y direction side surface 55c of the terminal main body portion 51, the joining portion 57 extends from the second side surface portion 58 toward the first side surface portion 56 while expanding outward gradually in the side direction and connects the second side surface portion 58 and the first side surface portion 56.

The first side surface portion 56 of the −X direction side surface 55d and the first side surface portion 56 of the +Y direction side surface 55c of the terminal main body portion 51 are respectively substantially flush with the left side surface 9d and the front side surface 9c of the sealing resin 9 and are exposed from the left side surface 9d and the front side surface 9c. That is, the first side surface portion 56 of the −X direction side surface 55d and the first side surface portion 56 of the +Y direction side surface 55c of the terminal main body portion 51 constitute second exposed surfaces of the first gate terminal 5 that are continuous to the first exposed surface. An angle portion formed by intersection of the two first side surface portions 56 of the terminal main body portion 51 and angle portions formed by intersections of the respective first side surface portions 56 and the lower surface 53 are also exposed from the sealing resin 9.

The terminal detachment restraining portion 52 is formed such as to protrude outward in side directions from upper portions of the +X direction side surface 55f and the −Y direction side surface 55e of the terminal main body portion 51. An upper surface of the terminal detachment restraining portion 52 is flush with the upper surface 54 of the terminal main body portion 51.

At the +X direction side surface 55f and the −Y direction side surface 55e of the terminal main body portion 51, a side surface portion 59, between a lower edge of the terminal detachment restraining portion 52 and a lower edge of the terminal main body portion 51, extends while narrowing gradually inward in side directions from the lower edge of the terminal detachment restraining portion 52 to the lower edge of the terminal main body portion 51 and connects the lower edge of the terminal detachment restraining portion 52 and the lower edge of the terminal main body portion 51. A height position of the lower edge of the terminal detachment restraining portion 52 is further to the upper side (+Z direction side) by just h1 than height positions of upper ends of the first side surface portions 56 of the −X direction side surface 55d and the +Y direction side surface 55c of the terminal main body portion 51.

One end of the second bonding wire 12 is connected to the upper surface 54 of the terminal main body portion 51 within the upper surface of the first gate terminal 5 (including the upper surface 54 of the terminal main body portion 51 and the upper surface of the terminal detachment restraining portion 52).

A solder plating layer 95, arranged to increase solder wettability, is formed on the lower surface 53 of the terminal main body portion 51 exposed from the lower surface 9b of the sealing resin 9 and the first side surface portions 56 exposed from the −X direction side surface 9d and the +Y direction side surface 9c of the sealing resin 9. In FIG. 16 to FIG. 23, the lead plating layer 95 is omitted for convenience of description.

The second gate terminal 7 has, integrally, a terminal main body portion 71 of quadratic prism shape having a quadrilateral bottom surface shape, and a terminal detachment restraining portion 72. The terminal main body portion 71 has a lower surface 73, an upper surface 74, positioned at an opposite side to the lower surface 73, and four side surfaces, connecting the lower surface 73 and the upper surface 74. The four side surfaces are constituted of a +Y direction side surface 75c, a −X direction side surface 75d, a −Y direction side surface 75e, and a +X direction side surface 75f.

The +X direction side surface 75f is parallel to the Y direction in plan view. The +Y direction side surface 75c extends in the −X direction from a +Y direction side edge portion of the +X direction side surface 75f in plan view. The −X direction side surface 75d extends in the −Y direction and obliquely toward the +X direction from a −X direction side edge portion of the +Y direction side surface 75c in plan view. The −Y direction side surface 75e extends in the −X direction and obliquely toward the +Y direction from a −Y direction side edge portion of the +X direction side surface 75f and is connected to a −Y direction side edge portion of the −X direction side surface 75d in plan view. A connection portion of the −X direction side surface 75d and the −Y direction side surface 75e is formed to a curved surface 75g projecting outward of the terminal main body portion 71 in plan view.

The lower surface 73 of the terminal main body portion 71 is substantially flush with the lower surface 9b of the sealing resin 9 and is exposed from the lower surface 9b. That is, the lower surface 73 of the terminal main body portion 71 constitutes a first exposed surface of the second gate terminal 7. In bottom view (plan view), the terminal main body portion 71 is disposed at the corner portion at the +Y direction side and +X direction side of the lower surface 9b of the sealing resin 9. More specifically, in bottom view, the terminal main body portion 71 is disposed in an orientation where, two sides, among four sides of the lower surface 73 of the terminal main body portion 71, that correspond to lower ends of the +X direction side surface 75f and the +Y direction side surface 75c are respectively substantially parallel to two sides, among the four sides of the lower surface 9b of the sealing resin 9, that correspond to lower ends of the +X direction side surface 9f and the +Y direction side surface 9c.

That is, the lower surface (first exposed surface) 73 of the terminal main body portion 71 is, in plan view, of a quadrilateral shape having a first side and a second side matching two sides of the corner portion of the sealing resin 9 at which the lower surface 73 is disposed and having a third side (lower edge of the −X direction side surface 75d) and a fourth side (lower edge of the −Y direction side surface 75e) with one ends connected respectively to the first side and the second side and other ends connected mutually. A connection portion of the third side and the fourth side is formed to a curved shape projecting outward of the lower surface (first exposed surface) 73.

Each of the +X direction side surface 75f and the +Y direction side surface 75c of the terminal main body portion 75 has a first side surface portion 76, a second side surface portion 78, and a joining portion 77. The first side surface portion 76 is continuous to the lower surface 73 and extends substantially perpendicularly toward the upper surface 74. The second side surface portion 78 is continuous to the upper surface 74 and extends substantially perpendicularly toward the lower surface 73. At each of the +X direction side surface 75f and the +Y direction side surface 75c of the terminal main body portion 71, the first side surface portion 76 protrudes further outward in a side direction (direction orthogonal to the Z direction) than the second side surface portion 78. At each of the +X direction side surface 75f and the +Y direction side surface 75c of the terminal main body portion 71, the joining portion 77 extends from the second side surface portion 78 toward the first side surface portion 76 while expanding outward gradually in the side direction and connects the second side surface portion 78 and the first side surface portion 76.

The first side surface portion 76 of the +X direction side surface 75f and the first side surface portion 76 of the +Y direction side surface 75c of the terminal main body portion 71 are respectively substantially flush with the +X direction side surface 9f and the +Y direction side surface 9c of the sealing resin 9 and are exposed from the +X direction side surface 9f and the +Y direction side surface 9c. That is, the first side surface portion 76 of the +X direction side surface 75f and the first side surface portion 76 of the +Y direction side surface 75c of the terminal main body portion 71 constitute second exposed surfaces of the second gate terminal 7 that are continuous to the first exposed surface. An angle portion formed by intersection of the two first side surface portions 76 of the terminal main body portion 71 and angle portions formed by intersections of the respective first side surface portions 76 and the lower surface 73 are also exposed from the sealing resin 9.

The terminal detachment restraining portion 72 is formed such as to protrude outward in side directions from upper portions of the −X direction side surface 75d and the −Y direction side surface 75e of the terminal main body portion 71. An upper surface of the terminal detachment restraining portion 72 is flush with the upper surface 74 of the terminal main body portion 71.

At the −X direction side surface 75d and the −Y direction side surface 75e of the terminal main body portion 71, a side surface portion 79, between a lower edge of the terminal detachment restraining portion 72 and a lower edge of the terminal main body portion 71, extends while narrowing gradually inward in side directions from the lower edge of the terminal detachment restraining portion 72 to the lower edge of the terminal main body portion 71 and connects the lower edge of the terminal detachment restraining portion 72 and the lower edge of the terminal main body portion 71. A height position of the lower edge of the terminal detachment restraining portion 72 is further to the upper side (+Z direction side) by just h1 than height positions of upper ends of the first side surface portions 76 of the +X direction side surface 75f and the +Y direction side surface 75c of the terminal main body portion 71.

One end of the fourth bonding wire 14 is connected to the upper surface 74 of the terminal main body portion 71 within the upper surface of the first gate terminal 7 (including the upper surface 74 of the terminal main body portion 71 and the upper surface of the terminal detachment restraining portion 72).

A solder plating layer (not shown) 97, arranged to increase solder wettability, is formed on the lower surface 73 of the terminal main body portion 71 exposed from the lower surface 9b of the sealing resin 9 and the first side surface portions 76 exposed from the +X direction side surface 9f and the +Y direction side surface 9c of the sealing resin 9. In FIG. 16 to FIG. 23, the lead plating layer 97 is omitted for convenience of description.

Referring to FIG. 16, FIG. 17, FIG. 22, FIG. 23, FIG. 25, and FIG. 26, the common source terminal 8 has, integrally, a terminal main body portion 81 of quadratic prism shape having a quadrilateral (trapezoidal) bottom surface shape, and a terminal detachment restraining portion 82. The terminal main body portion 81 has a lower surface 83, an upper surface 84, positioned at an opposite side to the lower surface 83, and four side surfaces, connecting the lower surface 83 and the upper surface 84. The four side surfaces are constituted of a +Y direction side surface 85c, a −X direction side surface 85d, a −Y direction side surface 85e, and a +X direction side surface 85f.

The +Y direction side surface 85c is parallel to the X direction in plan view. The −X direction side surface 85d extends in the −Y direction and obliquely toward the +X direction from a −X direction side edge portion of the +Y direction side surface 85c in plan view. The +X direction side surface 85f extends in the −Y direction and obliquely toward the −X direction from a +X direction side edge portion of the +Y direction side surface 85c in plan view. The −Y direction side surface 85e connects a −Y direction side edge portion of the −X direction side surface 85d and a −Y direction side edge portion of the +X direction side surface 85f in plan view. Each of a connection portion of the −X direction side surface 85d and the −Y direction side surface 85e and a connection portion of the +X direction side surface 85f and the −Y direction side surface 85e is formed to a curved surface 85g projecting outward of the terminal main body portion 81.

The lower surface 83 of the terminal main body portion 81 is substantially flush with the lower surface 9b of the sealing resin 9 and is exposed from the lower surface 9b. That is, the lower surface 83 of the terminal main body portion 81 constitutes a first exposed surface of the common source terminal 8. In bottom view (plan view), the terminal main body portion 81 is disposed at a front side central portion of the lower surface 9b of the sealing resin 9. More specifically, in bottom view, the terminal main body portion 81 is disposed in an orientation where, a side, among four sides of the lower surface 83 of the terminal main body portion 81, that corresponds to a lower edge of the +Y direction side surface 85c is substantially parallel to a side, among the four sides of the lower surface 9b of the sealing resin 9, that corresponds to the lower edge of +Y direction side surface 9c.

That is, the lower surface (first exposed surface) 83 of the terminal main body portion 81 is, in plan view, of a quadrilateral shape having a first side, matching a side of the lower surface 9b of the sealing resin 9 corresponding to the lower edge of the +Y direction side surface 9c, a second side (lower edge of the −X direction side surface 85d) and a third side (lower edge of the +X direction side surface 85f) with respective one ends connected to respective ends of the first side, and a fourth side (lower edge of the −Y direction side surface 85e) connecting another end of the second side and another end of the third side. A connection portion of the second side and the fourth side and a connection portion of the third side and the fourth side are formed to curved shapes projecting outward of the lower surface (first exposed surface) 83 of the terminal main body portion 81.

Among the four side surfaces 85 of the terminal main body portion 81, the +Y direction side surface 85c has a first side surface portion 86, a second side surface portion 88, and a joining portion 87. The first side surface portion 86 is continuous to the lower surface 83 and extends substantially perpendicularly toward the upper surface 84. The second side surface portion 88 is continuous to the upper surface 84 and extends substantially perpendicularly toward the lower surface 83. The first side surface portion 86 protrudes further outward in a side direction (direction orthogonal to the Z direction) than the second side surface portion 88. The joining portion 87 extends from the second side surface portion 88 toward the first side surface portion 86 while expanding outward gradually in the side direction and connects the second side surface portion 88 and the first side surface portion 86.

The first side surface portion 86 of the +Y direction side surface 85c of the terminal main body 81 is substantially flush with the +Y direction side surface 9c of the sealing resin 9 and is exposed from the +Y direction side surface 9c. That is, the first side surface portion 86 of the +Y direction side surface 85c of the terminal main body portion 81 constitutes a second exposed surface of the common source terminal 8 that is continuous to the first exposed surface. An angle portion formed by intersection of the first side surface portion 86 of the terminal main body portion 81 and the lower surface 83 is also exposed from the sealing resin 9.

The terminal detachment restraining portion 82 is formed such as to protrude outward in side directions from upper portions of the −X direction side surface 85d, the −Y direction side surface 85e, and the +X direction side surface 85f of the terminal main body portion 81. An upper surface of the terminal detachment restraining portion 82 is flush with the upper surface 84 of the terminal main body portion 81.

At the −X direction side surface 85d, the −Y direction side surface 85e, and the +X direction side surface 85f of the terminal main body portion 81, a side surface portion 89, between a lower edge of the terminal detachment restraining portion 82 and a lower edge of the terminal main body portion 81, extends while narrowing gradually inward in side directions from the lower edge of the terminal detachment restraining portion 82 to the lower edge of the terminal main body portion 81 and connects the lower edge of the terminal detachment restraining portion 82 and the lower edge of the terminal main body portion 81. A height position of the lower edge of the terminal detachment restraining portion 82 is further to the upper side (+Z direction side) by just h1 than a height position of an upper end of the first side surface portions 86 of the +Y direction side surface 85c of the terminal main body portion 81.

One ends of the first bonding wire 11 and the third bonding wire 13 are connected to the upper surface 84 of the terminal main body portion 81 within the upper surface of the common source terminal 8 (including the upper surface 84 of the terminal main body portion 81 and the upper surface of the terminal detachment restraining portion 82).

A solder plating layer 98, arranged to increase solder wettability, is formed on the lower surface 83 of the terminal main body portion 81 exposed from the lower surface 9b of the sealing resin 9 and the first side surface portion 86 exposed from the +Y direction side surface 9c of the sealing resin 9. In FIG. 16 to FIG. 23, the lead plating layer 98 is omitted for convenience of description.

In a state where the respective terminals 4, 5, 6, 7, and 8 are resin-sealed together with the first semiconductor chip 2 and the second semiconductor chip 3, the sealing resin 9 extends around to below the respective terminal detachment restraining portions 42, 52, 62, 72, and 82, thus preventing detachment of the respective terminals 4, 5, 6, 7, and 8 from the sealing resin 9.

Referring to FIG. 23, in the present preferred embodiment, in plan view, Y-direction distances between each of a connection point of the wire 12 at the first gate terminal 5, a connection point of the wire 11 at the common source terminal 8, a connection point of the wire 13 at the common source terminal 8, and a connection point of the wire 14 at the second gate terminal 7 and the +Y direction side surface 9c of the sealing resin 9 are all equal.

Also, in regard to the X direction, a connection point of the wire 12 and a connection point of the wire 11 at the first semiconductor chip 2 and a connection point of the wire 13 and a connection point of the wire 14 at the second semiconductor chip 3 are positioned between the connection point of the wire 12 at the first gate terminal 5 and the connection point of the wire 14 at the second gate terminal 7.

Also, in regard to the X direction, the connection point of the wire 12 at the first gate terminal 5 is positioned in an interval from a −X direction end to a +X direction end of the first semiconductor chip 2. On the other hand, in regard to the X direction, the connection point of the wire 11 at the common source terminal 8 is positioned further to a +X direction side than the +X direction end of the first semiconductor chip 2.

Similarly, in regard to the X direction, the connection point of the wire 14 at the second gate terminal 7 is positioned in an interval from a −X direction end to a +X direction end of the second semiconductor chip 3. On the other hand, in regard to the X direction, the connection point of the wire 13 at the common source terminal 8 is positioned further to a −X direction side than the −X direction end of the second semiconductor chip 3.

Also, an X direction distance between the connection point of the wire 11 at the common source terminal 8 and the connection point of the wire 13 at the common source terminal 8 is shorter than an X direction distance between the connection point of the wire 12 at the first gate terminal 5 and the connection point of the wire 11 at the common source terminal 8. Similarly, an X direction distance between the connection point of the wire 11 at the common source terminal 8 and the connection point of the wire 13 at the common source terminal 8 is shorter than an X direction distance between the connection point of the wire 14 at the second gate terminal 7 and the connection point of the wire 13 at the common source terminal 8.

Referring to FIG. 22, the lower surface 9b of the sealing resin 9 has a +Y direction side 10c, a −X direction side 10d, a −Y direction side 10e, and a +X direction side 10f corresponding respectively to the +Y direction side surface 9c, the −X direction side surface 9d, the −Y direction side surface 9e, and the +X direction side surface 9f. In the present preferred embodiment, in bottom view, a shape of the lower surface 43 of the first drain terminal 4 and a shape of the lower surface 63 of the second drain terminal 6 are line symmetrical with respect to a virtual line passing through a center of an X-direction gap between these surfaces and extending in the Y direction. Also, a shape of the lower surface 53 of the first gate terminal 5 and a shape of the lower surface 73 of the second gate terminal 7 are line symmetrical with respect to a virtual line passing through a center of an X-direction gap between these surfaces and extending in the Y direction.

Let a length of the +Y direction side 10c (−Y direction side 10e) of the lower surface 9b of the sealing resin 9 be L and a length of the −X direction side 10d (+X direction side 10f) be W. Let a length in the X direction of each of a side of the lower surface 43 of the first drain terminal 4 corresponding to the −Y direction side surface 45e and a side of the lower surface 63 of the second drain terminal 6 corresponding to the −Y direction side surface 65e be LD1. Let a length in the Y direction of each of a side of the lower surface 43 of the first drain terminal 4 corresponding to the −X direction side surface 45d and a side of the lower surface 63 of the second drain terminal 6 corresponding to the +X direction side surface 65f be LD2.

Let a length in the X direction of each of a side of the lower surface 53 of the first gate terminal 5 corresponding to the +Y direction side surface 55c and a side of the lower surface 73 of the second gate terminal 7 corresponding to the +Y direction side surface 75c be LG1. Let a length in the Y direction of each of a side of the lower surface 53 of the first gate terminal 5 corresponding to the −X direction side surface 55d and a side of the lower surface 73 of the second gate terminal 7 corresponding to the +X direction side surface 75f be LG2. Let an X-direction length of a side of the lower surface 83 of the common source terminal 8 corresponding to the +Y direction side surface 85c be LS1. Let a Y-direction length of the lower surface 83 of the common source terminal 8 be LS2.

Let an X-direction interval between the side of the lower surface 43 of the first drain terminal 4 corresponding to the −Y direction side surface 45e and the side of the lower surface 63 of the second drain terminal 6 corresponding to the −Y direction side surface 65e be d1. Let an X-direction interval between the side of the lower surface 53 of the first gate terminal 5 corresponding to the +Y direction side surface 55c and the side of the lower surface 83 of the common source terminal 8 corresponding to the +Y direction side surface 85c be d2.

Let an X-direction interval between the side of the lower surface 73 of the second gate terminal 7 corresponding to the +Y direction side surface 75c and the side of the lower surface 83 of the common source terminal 8 corresponding to the +Y direction side surface 85c be d3. Let a Y-direction interval between the side of the lower surface 43 of the first drain terminal 4 corresponding to the −X direction side surface 45d and the side of the lower surface 53 of the first gate terminal 5 corresponding to the −X direction side surface 55d be d4. Let a Y-direction interval between the side of the lower surface 63 of the second drain terminal 6 corresponding to the +X direction side surface 65f and the side of the lower surface 73 of the second gate terminal 7 corresponding to the +X direction side surface 75f be d5.

The semiconductor device 1 preferably satisfies the following formulae (7) and (8).

$$d1=d2=d3=d4=d5 \qquad (7)$$

$$LS2=LG2 \qquad (8)$$

The semiconductor device 1 preferably further satisfies the following formulae (9), (10), (11), and (12).

$$LS1=d1 \qquad (9)$$

$$LD2=LD1 \qquad (10)$$

$$LG2=LG1 \qquad (11)$$

$$LD1>LG1 \qquad (12)$$

In the present preferred embodiment, LS1, LS2, LG1, LG2, LS1, LS2, and d1 to d5 are set to satisfy the formulae (7) to (12).

Specifically, in the present preferred embodiment, LS1, LS2, LG1, LG2, LS1, LS2, and d1 to d5 are set to the following lengths.

$$LD1=LD2=0.3 \text{ mm}$$

$$LG1=LG2=LS2=0.1 \text{ mm}$$

$$d1=d2=d3=d4=d5=LS1=0.2 \text{ mm}$$

For efficient dissipation of the heat of the semiconductor chips 2 and 3, it is better for areas of the lower surfaces 43 and 63 of the drain terminals 4 and 6 to be larger. However if the areas of the lower surfaces 43 and 63 of the drain terminals 4 and 6 are increased, the semiconductor device 1A increases in size. In the present preferred embodiment, to miniaturize the semiconductor device 1A, sizes of the lower surfaces 43 and 63 of the drain terminals 4 and 6 are set to the minimum necessary sizes for heat dissipation of the semiconductor chips 2 and 3. Specifically, the lengths LD1 and LD2 of the two sides of the lower surfaces 43 and 63 of the drain terminals 4 and 6 are set to 0.3 mm.

The one ends of the bonding wires 12 and 14 are connected to the upper surfaces 54 and 74 of the gate terminals 5 and 7. In the present preferred embodiment, in order to miniaturize the semiconductor device 1A, sizes of the upper surfaces 54 and 74 of the gate terminals 5 and 7 are set to the minimum necessary sizes for connecting the one ends of the bonding wires 12 and 14. Specifically, the lengths LG1 and LG2 of the two sides of the upper surfaces 54 and 74 of the gate terminals 5 and 7 are set to 0.1 mm.

As shall be described below, in mounting the semiconductor device 1A on a mounting substrate 201 (see FIG. 12 and FIG. 13), the lower surfaces 43, 53, 63, 73, and 83 (more accurately, the lead plating layers 94, 95, 96, 97, and 98) of the respective terminals 4, 5, 6, 7, and 8 are coated with solder 211. In this process, a measure must be taken to prevent mutual contact of the solder coated on the lower surfaces of the terminals 4 to 8 (more accurately, the lead plating layers 94 to 98) that are adjacent. In the present preferred embodiment, in order to miniaturize the semiconductor device 1A, the intervals between the terminals 4 to 8 that are adjacent are set to the minimum necessary intervals for preventing mutual contact of the solder coated on the terminals 4 to 8 (more accurately, the lead plating layers 94 to 98) that are adjacent. Specifically, the intervals d1 to d5 between the terminals 4 to 8 that are adjacent are set to 0.2 mm.

To acquire such intervals d1 to d5, the X-direction length LS1 and the Y-direction LS2 of the lower surface 83 of the common source terminal 8 are set to 0.2 mm and 0.1 mm, respectively.

That is, in the present preferred embodiment, the length L of the semiconductor device 1A is 0.8 mm (=0.3 mm+0.2 mm+0.3 mm). The width W of the semiconductor device 1A is 0.6 mm (=0.1 mm+0.2 mm+0.3 mm). A height H (see FIG. 20 and FIG. 21) of the semiconductor device 1A is 0.36 mm. Also, a height h (see FIG. 20 and FIG. 21) of each of the first side surface portions 46, 56, 66, 76, and 86 of the respective terminals 4, 5, 6, 7, and 8 exposed from the side surfaces 9c to 9f of the sealing resin 9 is 0.06 mm. The abovementioned dimensions of the respective portions are but an example and are not restricted thereto.

Figure 27:
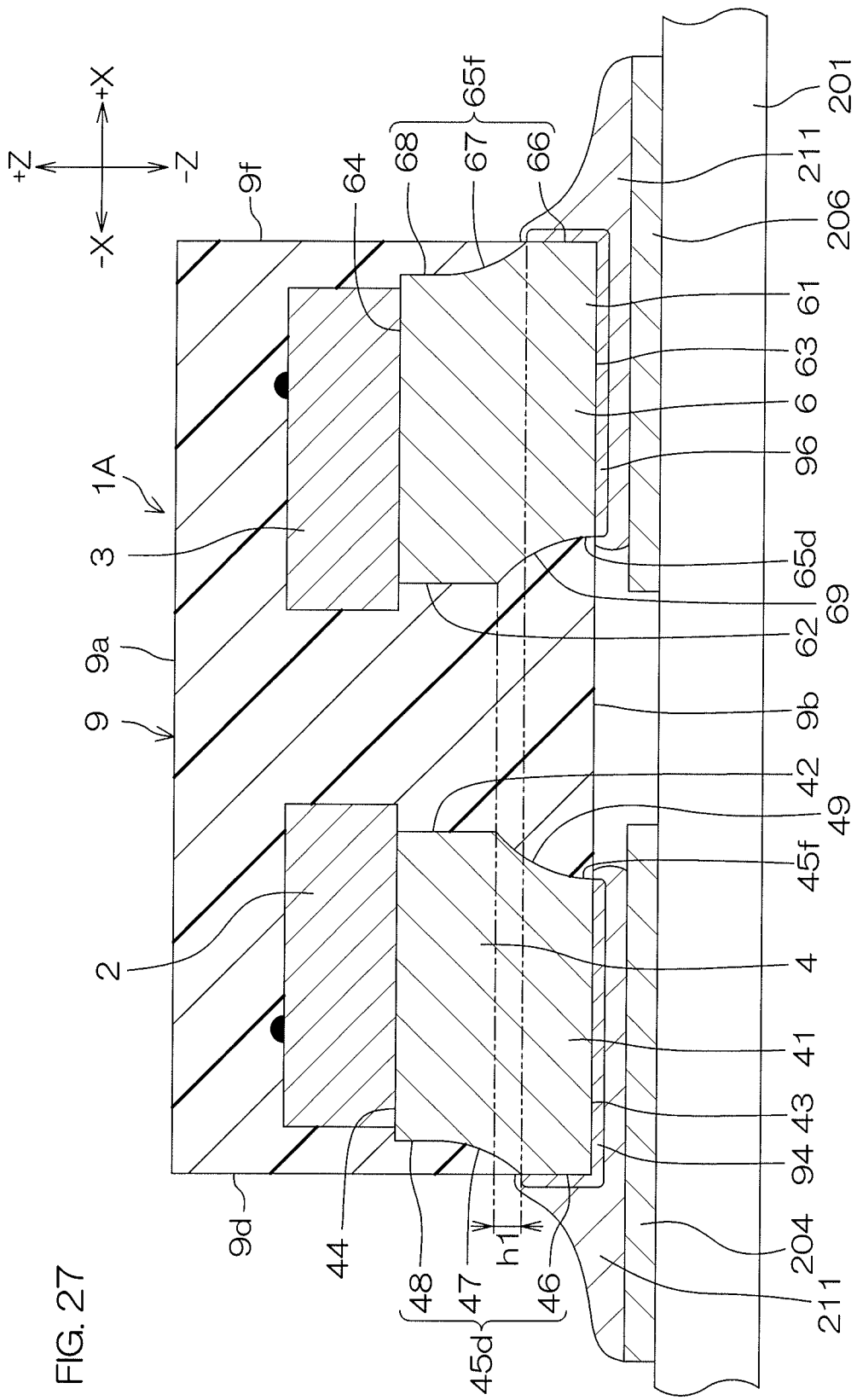
FIG. 27 is a sectional view, corresponding to the sectional view of FIG. 24, of a mounted state of the semiconductor device of FIG. 16.
Figure 28:
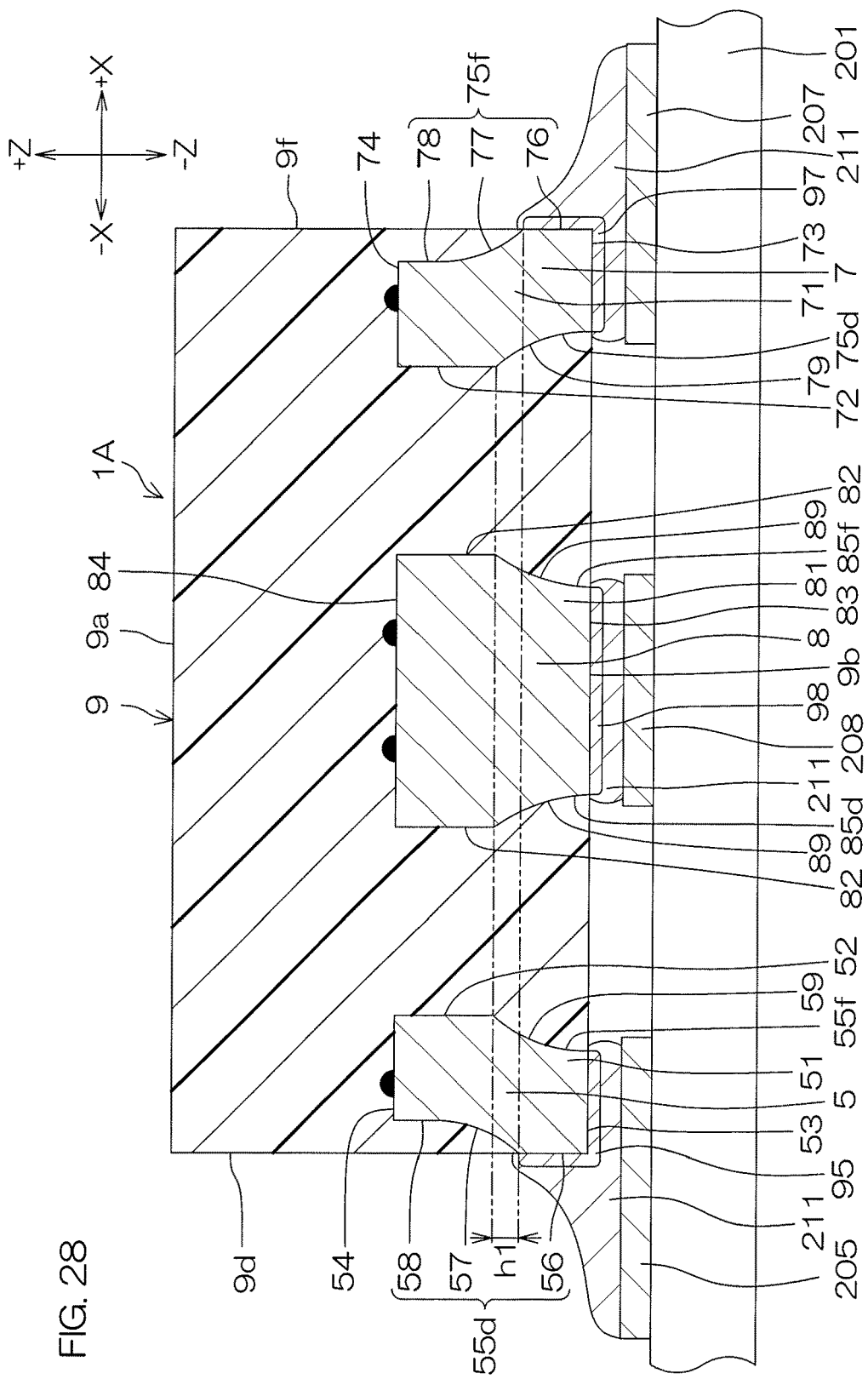
FIG. 28 is a sectional view, corresponding to the sectional view of FIG. 25, of the mounted state of the semiconductor device of FIG. 16.

FIG. 27 and FIG. 28 are illustrative sectional views of a mounted state of the semiconductor device 1A. FIG. 27 is a sectional view corresponding to FIG. 24, and FIG. 28 is a sectional view corresponding to FIG. 25.

The semiconductor device 1A is mounted on a surface of the mounting substrate (wiring substrate) 201. A first drain terminal land 204, a first gate terminal land 205, a second drain terminal land 206, a second gate terminal land 207, and a common source terminal land 208 are formed on the surface 202 of the mounting substrate 201.

To mount the semiconductor device 1A on the mounting substrate 201, first, the solder 211 that is creamy is coated on surfaces of the respective lands 204 to 208 on the mounting substrate 201. Next, the semiconductor device 1A is placed on the lands 204 to 208 in an orientation such that the lower surface 43 of the terminal 4, the lower surface 53 of the terminal 5, the lower surface 63 of the terminal 6, the lower surface 73 of the terminal 7, and the lower surface 83 of the terminal 8 of the semiconductor device 1A face the lands 204, 205, 206, 207, and 208, respectively, on the mounting substrate 201.

Next, the semiconductor device 1A, in a state of being pressed against the lands 204 to 208 of the mounting substrate 201, is heated for a fixed time and thereafter cooled. The terminals 4, 5, 6, 7, and 8 of the semiconductor device 1A are thereby bonded by the solder 211 to the lands 204, 205, 206, 207, and 208, respectively, on the mounting substrate 201.

The plating layers 94, 95, 96, 97, and 98 for increasing solder wettability are formed on the lower surfaces 43, 53, 63, 73, and 83 and the first side surface portions 46, 56, 66, 76, and 86 of the respective terminals 4, 5, 6, 7, and 8. Therefore when the lower surfaces 43, 53, 63, 73, and 83 of the respective terminals 4, 5, 6, 7, and 8 become bonded to the cream solder 211 on the respective lands 204, 205, 206, 207, and 208, the cream solder 211 closely adheres, so as to creep up, to the first side surface portions 46, 56, 66, 76, and 86 of the respective terminals 4, 5, 6, 7, and 8. Consequently, amounting strength of the semiconductor device 1A and the mounting substrate 201 can be improved and connection reliability can be improved.

Also, so-called solder fillets are thereby formed on the first side surface portions 46, 56, 66, 76, and 86 of the respective terminals 4, 5, 6, 7, and 8 and therefore bonding (soldering) states of the respective terminals 4, 5, 6, 7, and 8 and the respective lands 204, 205, 206, 207, and 208 can be readily inspected visually.

With the semiconductor device 1A according to the second preferred embodiment described above, the source electrode of the first semiconductor chip 2 and the source electrode of the second semiconductor chip 3 are electrically connected to the common source terminal 8. Therefore there is no need to connect a source terminal of the first semiconductor chip 2 and a source terminal of the second semiconductor chip 3 at an exterior of the semiconductor device 1A in using the semiconductor device 1A as a bidirectional switch.

Also with the semiconductor device 1A according to the second preferred embodiment described above, the respective terminals 4, 5, 6, 7, and 8 have the lower surfaces (first exposed surfaces) 43, 53, 63, 73, and 83 that are substantially flush with the lower surface 9b of the sealing resin 9 and are exposed from the lower surface 9b of the sealing resin 9, and therefore miniaturization can be achieved in comparison to a semiconductor device having lead terminals projecting from an outer surface of the sealing resin 9.

Also with the semiconductor device 1A according to the second preferred embodiment described above, the respective terminals 4, 5, 6, 7, and 8 have the first side surface portions (second exposed surfaces) 46, 56, 66, 76, and 86 that are exposed from the side surfaces 9c to 9f of the sealing resin 9 and therefore confirmation of the bonding states (mounting properties) of the respective terminals 4, 5, 6, 7, and 8 and the respective lands 204, 205, 206, 207, and 208 is made easy.

Although with the second preferred embodiment described above, the respective terminals 4, 5, 6, 7, and 8 have the first side surface portions (second exposed surfaces) 46, 56, 66, 76, and 86 that are exposed from the side surfaces 9c to 9f of the sealing resin 9, such exposed surfaces 46, 56, 66, 76, and 86 do not have to be provided.

Also although with the second preferred embodiment described above, the respective terminals 4, 5, 6, 7, and 8 have the lower surfaces (first exposed surfaces) 43, 53, 63, 73, and 83 that are exposed from the lower surface 9b of the sealing resin 9, the respective terminals 4 to 8 may have, in place of such exposed surfaces, upper surfaces that are substantially flush with the upper surface 9a of the sealing resin 9 and are exposed from the upper surface 9a of the sealing resin 9.

Also, the first and second drain terminals 4 and 6 may have exposed surfaces exposed from one surface among the upper surface 9a and the lower surface 9b of the sealing resin 9, and the first gate terminal 5, the second gate terminal 7, and the common source terminal 8 may have exposed surfaces exposed from the other surface among the upper surface 9a and the lower surface 9b of the sealing resin 9.

The present application corresponds to Japanese Patent Application No. 2017-57831 filed in the Japan Patent Office on Mar. 23, 2017 and Japanese Patent Application No. 2017-249969 filed in the Japan Patent Office on Dec. 26, 2017, and the entire disclosures of these applications are incorporated herein by reference.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A semiconductor device comprising:
   a first semiconductor chip, constituted of a MOSFET;
   a second semiconductor chip, constituted of a MOSFET;
   a first drain terminal, electrically connected to a drain electrode of the first semiconductor chip;
   a first gate terminal, electrically connected to a gate electrode of the first semiconductor chip;
   a second drain terminal, electrically connected to a drain electrode of the second semiconductor chip;

a second gate terminal, electrically connected to a gate electrode of the second semiconductor chip;
a common source terminal, electrically connected to a source electrode of the first semiconductor chip and a source electrode of the second semiconductor chip; and
a sealing resin, sealing the respective semiconductor chips and the respective terminals; and
wherein each of the terminals has an exposed surface substantially flush with an outer surface of the sealing resin and exposed from the outer surface.

2. The semiconductor device according to claim 1, wherein the sealing resin has two opposing surfaces and a side surface joining the opposing surfaces.

3. The semiconductor device according to claim 2, wherein the exposed surface of each terminal includes a first exposed surface substantially flush with one surface of the two surfaces of the sealing resin and exposed from the one surface.

4. The semiconductor device according to claim 3, wherein the exposed surface of each terminal further includes a second exposed surface, continuous to the first exposed surface of the terminal, substantially flush with the side surface of the sealing resin and exposed from the side surface.

5. The semiconductor device according to claim 4, wherein the sealing resin is of rectangular parallelepiped shape with plan view shapes of the two surfaces being rectangular and the side surface includes four side surfaces joining opposing sides of the two surfaces to each other.

6. The semiconductor device according to claim 5, wherein the one surface of the sealing resin has a first side and a second side that are mutually opposed, a third side joining one ends of the first side and the second side together, and a fourth side joining other ends of the first side and the second side together,
the first exposed surface of the first drain terminal is disposed at a first corner portion at which the first side and the third side of the one surface are joined, the first exposed surface of the second drain terminal is disposed at a second corner portion at which the first side and the fourth side of the one surface are joined,
the first exposed surface of the first gate terminal is disposed at a third corner portion at which the second side and the third side of the one surface are joined, the first exposed surface of the second gate terminal is disposed at a fourth corner portion at which the second side and the fourth side of the one surface are joined, and
the first exposed surface of the common source terminal is disposed at an intermediate position of the one surface between the first exposed surface of the first gate terminal and the first exposed surface of the second gate terminal.

7. The semiconductor device according to claim 6, wherein the first exposed surface of each terminal has a rectangular shape having four sides parallel to the four sides of the one surface, and
when, with the first exposed surface of each drain terminal, a length of the side parallel to the first side is LD1 and a length of the side parallel to the third side is LD2, and with the first exposed surface of each gate terminal, a length of the side that is parallel to the first side is LG1 and a length of the side parallel to the third side is LG2, and with the first exposed surface of the source terminal, a length of the side that is parallel to the first side is LS1 and a length of the side parallel to the third side is LS2, and
an interval, along a direction along the first side, between the first exposed surface of the first drain terminal and the first exposed surface of the second drain terminal is dl, an interval, along a direction along the second side, between the first exposed surface of the first gate terminal and the first exposed surface of the common source terminal is d2, an interval, along the direction along the second side, between the first exposed surface of the second gate terminal and the first exposed surface of the common source terminal is d3, an interval, along a direction along the third side, between the first exposed surface of the first drain terminal and the first exposed surface of the first gate terminal is d4, and an interval, along a direction along the fourth side, between the first exposed surface of the second drain terminal and the first exposed surface of the second gate terminal is d5, the following formulae (a) and (b) are established.

$$d1=d2=d3=d4=d5 \quad (a)$$

$$LS2=LG2 \quad (b)$$

8. The semiconductor device according to claim 7, wherein the following formulae (c) to (f) are further established.

$$LS1=d1 \quad (c)$$

$$LD2=LD1 \quad (d)$$

$$LG2=LG1 \quad (e)$$

$$LD1>LG1 \quad (f)$$

9. The semiconductor device according to claim 6, wherein the first exposed surface of each of the first drain terminal, the second drain terminal, the first gate terminal, and the second gate terminal has, in plan view, a quadrilateral shape having a fifth side and a sixth side, matching two sides of a corner portion of the sealing resin at which the exposed surface is disposed, and a seventh side and an eighth side, with one ends connected to the fifth side and sixth side, respectively, and other ends connected to each other, and a connection portion of the seventh side and the eighth side is formed to a curved shape projecting outward of the first exposed surface.

10. The semiconductor device according to claim 9, wherein the first exposed surface of the common source terminal has, in plan view, a quadrilateral shape having a ninth side matching the second side of the one surface of the sealing resin, a tenth side and an eleventh side, with one ends respectively connected to respective ends of the ninth side, and a twelfth side, connecting the tenth side and the eleventh side, and a connection portion of the tenth side and the twelfth side and a connection portion of the eleventh side and the twelfth side are formed to curved shapes projecting outward of the first exposed surface.

11. The semiconductor device according to claim 4, wherein a sum of an area of the first exposed surface of the first drain terminal and an area of the first exposed surface of the second drain terminal is ¼ to ⅜ of an area of an entirety of the one surface of the sealing resin.

12. The semiconductor device according to claim 4, wherein a sum of an area of the first exposed surface of the first drain terminal, an area of the first exposed surface of the second drain terminal, an area of the first exposed surface of the first gate terminal, an area of the first exposed surface of the second gate terminal, and an area of the first exposed surface of the common source terminal is 1/3 to 11/24 of an area of an entirety of the one surface of the sealing resin.

13. The semiconductor device according to claim 3, wherein the sealing resin is of rectangular parallelepiped shape with plan view shapes of the two surfaces being rectangular and the side surface includes four side surfaces joining opposing sides of the two surfaces to each other.

14. The semiconductor device according to claim 13, wherein the one surface of the sealing resin has a first side and a second side that are mutually opposed, a third side joining one ends of the first side and the second side together, and a fourth side joining other ends of the first side and the second side together,
- the first exposed surface of the first drain terminal is disposed at a first corner portion at which the first side and the third side of the one surface are joined, the first exposed surface of the second drain terminal is disposed at a second corner portion at which the first side and the fourth side of the one surface are joined,
- the first exposed surface of the first gate terminal is disposed at a third corner portion at which the second side and the third side of the one surface are joined, the first exposed surface of the second gate terminal is disposed at a fourth corner portion at which the second side and the fourth side of the one surface are joined, and
- the first exposed surface of the common source terminal is disposed at an intermediate position of the one surface between the first exposed surface of the first gate terminal and the first exposed surface of the second gate terminal.

15. The semiconductor device according to claim 14, wherein the first exposed surface of each of the first drain terminal, the second drain terminal, the first gate terminal, and the second gate terminal has, in plan view, a quadrilateral shape having a fifth side and a sixth side, matching two sides of a corner portion of the sealing resin at which the exposed surface is disposed, and a seventh side and an eighth side, with one ends connected to the fifth side and sixth side, respectively, and other ends connected to each other, and a connection portion of the seventh side and the eighth side is formed to a curved shape projecting outward of the first exposed surface.

16. The semiconductor device according to claim 15, wherein the first exposed surface of the common source terminal has, in plan view, a quadrilateral shape having a ninth side matching the second side of the one surface of the sealing resin, a tenth side and the eleventh side, with one ends respectively connected to respective ends of the ninth side, and a twelfth side, connecting the tenth side and the eleventh side, and a connection portion of the tenth side and the twelfth side and a connection portion of the eleventh side and the twelfth side are formed to curved shapes projecting outward of the first exposed surface.

17. The semiconductor device according to claim 14, wherein the first exposed surface of each terminal has a rectangular shape having four sides parallel to the four sides of the one surface, and when, with the first exposed surface of each drain terminal, a length of the side parallel to the first side is LD1 and a length of the side parallel to the third side is LD2, and with the first exposed surface of each gate terminal, a length of the side that is parallel to the first side is LG1 and a length of the side parallel to the third side is LG2, and with the first exposed surface of the source terminal, a length of the side that is parallel to the first side is LS1 and a length of the side parallel to the third side is LS2, and an interval, along a direction along the first side, between the first exposed surface of the first drain terminal and the first exposed surface of the second drain terminal is d1, an interval, along a direction along the second side, between the first exposed surface of the first gate terminal and the first exposed surface of the common source terminal is d2, an interval, along the direction along the second side, between the first exposed surface of the second gate terminal and the first exposed surface of the common source terminal is d3, an interval, along a direction along the third side, between the first exposed surface of the first drain terminal and the first exposed surface of the first gate terminal is d4, and an interval, along a direction along the fourth side, between the first exposed surface of the second drain terminal and the first exposed surface of the second gate terminal is d5, the following formulae (a) and (b) are established.

$$d1=d2=d3=d4=d5 \quad (a)$$

$$LS2=LG2 \quad (b)$$

18. The semiconductor device according to claim 17, wherein the following formulae (c) to (f) are further established.

$$LS1=d1 \quad (c)$$

$$LD2=LD1 \quad (d)$$

$$LG2=LG1 \quad (e)$$

$$LD1>LG1 \quad (f)$$

19. The semiconductor device according to claim 3, wherein a sum of an area of the first exposed surface of the first drain terminal and an area of the first exposed surface of the second drain terminal is 1/4 to 3/8 of an area of an entirety of the one surface of the sealing resin.

20. The semiconductor device according to claim 3, wherein a sum of an area of the first exposed surface of the first drain terminal, an area of the first exposed surface of the second drain terminal, an area of the first exposed surface of the first gate terminal, an area of the first exposed surface of the second gate terminal, and an area of the first exposed surface of the common source terminal is 1/3 to 11/24 of an area of an entirety of the one surface of the sealing resin.

* * * * *